United States Patent
Naka et al.

(10) Patent No.: US 7,821,303 B2
(45) Date of Patent: Oct. 26, 2010

(54) COMPARATOR AND A/D CONVERTER

(75) Inventors: Junichi Naka, Osaka (JP); Koji Sushihara, Nara (JP)

(73) Assignee: Panasonic Corporation, Osaka (JP)

( * ) Notice: Subject to any disclaimer, the term of this patent is extended or adjusted under 35 U.S.C. 154(b) by 169 days.

(21) Appl. No.: 12/093,565

(22) PCT Filed: Apr. 18, 2006

(86) PCT No.: PCT/JP2006/308143

§ 371 (c)(1),
(2), (4) Date: May 13, 2008

(87) PCT Pub. No.: WO2007/072588

PCT Pub. Date: Jun. 28, 2007

(65) Prior Publication Data

US 2009/0179787 A1    Jul. 16, 2009

(30) Foreign Application Priority Data

Dec. 20, 2005  (JP)  ................ 2005-366593

(51) Int. Cl.
G01R 19/00   (2006.01)
(52) U.S. Cl. .............. 327/57; 327/55; 327/65
(58) Field of Classification Search ........... 327/63, 327/65, 67, 90, 52, 54, 55, 57
See application file for complete search history.

(56) References Cited

U.S. PATENT DOCUMENTS 6,144,231 A * 11/2000 Goldblatt .............. 327/57
6,707,413 B2 * 3/2004 Sushihara et al. ........ 341/159
6,930,516 B2 * 8/2005 Gabara .................... 327/51
2002/0180589 A1  12/2002 Gabara
2003/0048213 A1  3/2003 Sushihara et al.

FOREIGN PATENT DOCUMENTS

| JP | 4-43718 | 2/1992 |
|---|---|---|
| JP | 2003-69394 | 3/2003 |
| JP | 2003-158456 | 5/2003 |

OTHER PUBLICATIONS

Sushihara, K., et al., "7b 450MSample/s 50mW CMOS ADC in 0.3mm$^2$", ISSCC 2002 / SESSION 10 / High-Speed ADCs, ISSCC 2002 Visuals Supplement, 2002, vol. 10.3, IEEE.

* cited by examiner

*Primary Examiner*—Hai L Nguyen
(74) *Attorney, Agent, or Firm*—McDermott Will & Emery LLP

(57) ABSTRACT

A comparator used in a parallel-type A/D converter, wherein a comparator 100 includes reset transistors mra and mrb. When the comparator 100 is in the Reset state, the inverted signal /CLK of the clock signal is given to the PMOS reset transistors mra and mrb so as to forcibly reset both of the voltages at two internal nodes Va and Vb being a differential pair to a predetermined reset voltage by the reset transistors mra and mrb. The inverted signal /CLK of the clock signal is produced with a predetermined delay. Thus, when the comparator 100 is in the Reset state, the point in time at which to cancel the reset of the internal nodes Va and Vb is delayed from that at which the comparator performs a comparison operation. Therefore, even if the frequency of the clock signal and the frequency of the analog input signal are high, the voltages at the internal nodes forming a differential pair are well-balanced when the comparator is in the Reset state, thus improving the voltage comparison precision.

7 Claims, 16 Drawing Sheets

INVERTED CLOCK GENERATION CIRCUIT

US 7,821,303 B2

COMPARATOR AND A/D CONVERTER

RELATED APPLICATIONS

This application is the U.S. National Phase under 35 U.S.C. §371 of International Application No. PCT/JP2006/308143, filed on Apr. 18, 2006, which in turn claims the benefit of Japanese Patent Application No. 2005-366593, filed on Dec. 20, 2005, the disclosures of which Applications are incorporated by reference herein.

TECHNICAL FIELD

The present invention relates to a comparator for receiving a plurality of differential voltage pairs and performing a comparison operation, in synchronism with a clock signal, on each differential voltage of the plurality of differential voltage pairs, and an A/D converter for converting an analog signal to a digital signal, or more particularly, an A/D converter having a parallel-type configuration.

BACKGROUND ART

In recent years, with the increase in the speed of information communications, the increase in the speed of an optical disc pick-up and the increase in the capacity, there is an increasing demand for an A/D converter with a high speed and a wide input bandwidth, which also has a reduced area and a reduced power consumption in order to reduce the cost.

FIG. 14 shows a configuration of a conventional parallel-type A/D converter 1400. A high-speed analog/digital conversion was realized by using this A/D converter.

The A/D converter 1400 includes a reference voltage generation circuit 1401, a chain of differential amplifiers 1402, a chain of comparators 1404, and an encoder circuit 1405. The reference voltage generation circuit 1401 divides the voltage between a high voltage-side reference voltage 1401a and a low voltage-side reference voltage 1401b by a plurality of resistors R1 to Rn to generate reference voltages VR1 to VRn+1. The reference voltages VR1 to VRn+1 are input to the chain of differential amplifiers 1402. The chain of differential amplifiers 1402 includes n+1 differential amplifiers and performs predetermined amplification operations in parallel on the relationships between the analog input signal voltage received from an analog input signal voltage input terminal AIN and the reference voltages VR1 to VRn+1, the results of which are input to the chain of comparators 1404. The chain of comparators 1404 compares in parallel the outputs of the chain of differential amplifiers 1402. The encoder circuit 1405 logically processes (converts) the comparison results output from the chain of comparators 1404 to thereby output a digital signal DOUT of a predetermined resolution. Where the number of bits of the A/D converter is denoted as N, n is about 2 to the power of N.

A conventional A/D converter having a parallel configuration as described above is advantageous in that the reference voltages and the analog input signal voltage can be simultaneously subjected to the comparison process in parallel, thus realizing a high-speed A/D conversion, as compared with those of the integrating type or the series parallel type.

However, there is a disadvantage that in order to increase the resolution of the A/D converter by one bit, it is necessary to double the number of differential amplifiers and the number of comparators, thus increasing the power consumption and the occupied area. Moreover, there is another disadvantage that increasing the resolution of the A/D converter increases the level of required specifications such as the offset error and the gain of the differential amplifiers, and the offset error and the comparison precision of the comparators.

Patent Document 1 discloses an A/D converter with improvements to disadvantages as set forth above.

FIG. 15 shows an exemplary configuration of another conventional parallel-type A/D converter 1500 with improvements to disadvantages of parallel-type A/D converters as set forth above. The A/D converter 1500 includes a reference voltage generation circuit 1501, a chain of differential amplifiers 1502, a chain of interpolation resistors 1503, a chain of comparators 1504, and an encoder circuit 1505. The structure of the A/D converter 1500 is similar to that of the A/D converter 1400 of FIG. 14 with respect to the chain of comparators and the encoder circuit, but differs therefrom with the smaller number of resistors included in the reference voltage generation circuit 1501, the smaller number of differential amplifiers included in the chain of differential amplifiers 1502, and the provision of the chain of interpolation resistors 1503.

The reference voltage generation circuit 1501 divides the voltage between a high voltage-side reference voltage 1501a and a low voltage-side reference voltage 1501b by m resistors R1 to Rm, being fewer than 2 to the power of N (N: the number of bits of the A/D converter), to generate reference voltages VR1 to VRm+1. The reference voltages VR1 to VRm+1 are input to the chain of differential amplifiers 1502. The chain of differential amplifiers 1502 includes m+1 differential amplifiers and performs predetermined amplification operations in parallel on the relationships between the analog input signal voltage received from an analog input signal voltage input terminal AIN and the reference voltages VR1 to VRm+1, the results of which are input to the chain of interpolation resistors 1503. The chain of interpolation resistors 1503 includes a plurality of resistors, and divides the differential voltage between the positive terminal output voltage and the negative terminal output voltage of two adjacent differential amplifiers and the differential voltage between the negative terminal output voltage and the positive terminal output voltage thereof, obtaining the results as differential interpolated voltages, which are given to the chain of comparators 1504. The chain of comparators 1504 compares in parallel the interpolated voltages. The encoder circuit 1505 logically processes (converts) the comparison results output from the chain of comparators 1504 to thereby output a digital signal DOUT of a predetermined resolution.

Where the number of bits to be interpolated is denoted as L bits, it is possible with the A/D converter 1500 to reduce the number of differential amplifiers to 1/L of that of the conventional A/D converter 1400. Therefore, it is advantageous in that it is possible to reduce the power consumption and the area. However, as with the conventional A/D converter 1400, there is a disadvantage that in order to increase the resolution of the A/D converter by one bit, it is necessary to double the number of comparators, thus increasing the power consumption and the occupied area. Moreover, as with the conventional A/D converter 1400, there is another disadvantage that increasing the resolution of the A/D converter increases the level of required specifications such as the offset error and the comparison precision of the comparators.

Patent Document 2 discloses an A/D converter with improvements to disadvantages as set forth above.

FIG. 16 shows an exemplary configuration of another conventional parallel-type A/D converter 1600 with further improvements to disadvantages of parallel-type A/D converters as set forth above. The A/D converter 1600 includes a reference voltage generation circuit 1601, a chain of differential amplifiers 1602, a chain of comparators 1604, and an encoder circuit 1605. The structure of the A/D converter 1600 is similar to that of the A/D converter 1500 of FIG. 15 with respect to the reference voltage generation circuit 1601, the chain of differential amplifiers 1602 and the encoder circuit 1605, but differs therefrom with the absence of the chain of interpolation resistors 1503, and the inputs to the chain of comparators being positive terminal and negative terminal output voltages of two adjacent differential amplifiers.

The reference voltage generation circuit 1601 divides the voltage between a high voltage-side reference voltage 1601*a* and a low voltage-side reference voltage 1601*b* by m resistors R1 to Rm, being fewer than 2 to the power of N (N: the number of bits of the A/D converter), to generate reference voltages VR1 to VRm+1. The reference voltages VR1 to VRm+1 are input to the chain of differential amplifiers 1602. The chain of differential amplifiers 1602 includes m+1 differential amplifiers and performs predetermined amplification operations in parallel on the relationships between the analog input signal voltage received from an analog input signal voltage input terminal AIN and the reference voltages VR1 to VRm+1, the results of which are input to the chain of comparators 1604. Each comparator included in the chain of comparators 1604 is given the positive terminal and negative terminal outputs of two adjacent differential amplifiers. The input transistor of each comparator is formed with a predetermined size ratio and compares, while performing interpolation, the positive terminal and negative terminal outputs of two adjacent differential amplifiers in parallel and in synchronism with a clock signal CLK. Note that the interpolation operation does not require interpolation resistors. The encoder circuit 1605 logically processes (converts) the comparison results output from the chain of comparators 1604 to thereby output a digital signal DOUT of a predetermined resolution.

FIG. 17 shows an exemplary configuration of a dynamic-type comparator 1700 used in the chain of comparators 1604 of the parallel-type A/D converter 1600 shown in FIG. 16. The comparator 1700 includes an input transistor section including NMOS transistors m11, m12, m21 and m22, and a positive feedback section (cross-coupled inverter latch section) including NMOS transistors m1*a* and m1*b* and PMOS transistors m3*a* and m3*b*, wherein an output terminal QB is connected to the gate terminals of the NMOS transistors m1*a* and m3*a* and the drain terminal of the PMOS m3*b* of the positive feedback section, and an output terminal Q is connected to the gate terminals of the transistors m1*b* and m3*b* and the drain terminal of the PMOS transistor m3*a* of the positive feedback section. An NMOS transistor m2*a* functioning as a switch in synchronism with the clock signal CLK is connected between the drain terminal of the NMOS transistor m1*a* and the drain terminal of the PMOS transistor m3*a*, and an NMOS transistor m2*b* functioning as a switch in synchronism with CLK is connected between the drain terminal of the NMOS transistor m1*b* and the drain terminal of the PMOS transistor m3*b*. The source terminals of the PMOS transistors m3*a* and m3*b* are connected to the power supply VDD. A PMOS transistor m4*a* functioning as a switch in synchronism with the clock signal CLK is connected between the drain terminal of the PMOS transistor m3*a* and the power supply VDD, and a PMOS transistor m4*b* functioning as a switch in synchronism with CLK is connected between the drain terminal of the PMOS transistor m3*b* and the power supply VDD.

The positive terminal output Vo1 and the negative terminal output Vob1 of the first differential amplifier and the positive terminal output Vo2 and the negative terminal output Vob2 of the second differential amplifier are connected to the gate terminals of the NMOS transistors m11, m21, m12 and m22, respectively, of the input transistor section, and the reference ground potential VSS is connected to the source terminals thereof. The drain terminals of the NMOS transistors m11 and m12 are connected to the source terminal of the NMOS transistor m1*a* (hereinafter referred to as a "node Va"), and the drain terminals of the NMOS transistors m21 and m22 are connected to the source terminal of the NMOS transistor m1*b* (hereinafter referred to as a "node Vb"). The gate terminals of the NMOS transistors m2*a* and m2*b* functioning as switches in synchronism with the clock signal CLK and the gate terminals of the PMOS transistors m4*a* and m4*b* functioning as switches in synchronism with the clock signal CLK are both connected to the clock signal CLK.

The input transistor section performs a predetermined weighting operation to thereby determine the threshold voltage Vtn, and outputs, to the positive feedback section, comparison results obtained by comparing the difference voltage between the positive terminal output voltage Vo1 and the negative terminal output voltage Vob1 of the first differential amplifier and the difference voltage between the positive terminal output voltage Vo2 and the negative terminal output voltage Vob2 of the second differential amplifier. The predetermined weighting operation is realized by, for example, setting the size ratio of the gate width W of the transistors of the input transistor section to a fixed value. For example, the threshold voltage Vtn can be obtained by setting the size ratio between the size of the transistor m11 and the size of the transistor m12 to 1:3 and the size ratio between the size of the transistor m12 and the size of the transistor m22 to 1:3.

In the positive feedback section, when the clock signal CLK is greater than or equal to a predetermined level (hereinafter referred to as being "high"), the PMOS transistors m4*a* and m4*b* are opened (OFF) and the NMOS transistors m2*a* and m2*b* are closed (ON), thus amplifying the comparison result output from the input transistor section, and the amplified comparison result is stored and output as a digital signal.

When the clock signal CLK is less than or equal to a predetermined level (hereinafter referred to as being "low"), the PMOS transistors m4*a* and m4*b* are closed (ON), and the output terminals Q and QB are reset to the power supply voltage VDD, i.e., "high". Moreover, the NMOS transistors m2*a* and m2*b* are opened (OFF), thus disconnecting the current path, whereby the power consumption becomes zero.

Thus, the transistors included in the input transistor section of the comparator have an arbitrary size ratio (i.e., the transistors are weighted), thereby advantageously eliminating the need for the chain of interpolation resistors used in conventional techniques. Moreover, this makes it possible to save the operation current and the area required for the interpolation circuit, thus advantageously reduce the power consumption and the area. Moreover, being a dynamic-type comparator, it also provides an advantage that the power consumption is reduced.

Patent Document 1: Japanese Laid-Open Patent Publication No. 4-43718

Patent Document 2: Japanese Laid-Open Patent Publication No. 2003-158456

DISCLOSURE OF THE INVENTION

Problems to be Solved by the Invention

An exemplary operation of the configuration of the dynamic-type comparator 1700 shown in FIG. 17, which is used in the chain of comparators 1604 of the parallel-type A/D converter shown in FIG. 16, will be reviewed again with reference to FIG. 18.

The clock signal CLK alternates between "low" and "high" with a constant cycle or a varying cycle. The positive terminal output voltage Vo1 and the negative terminal output voltage Vob1 of the first differential amplifier and the positive terminal output voltage Vo2 and the negative terminal output voltage Vob2 of the second differential amplifier are the results of a predetermined signal amplification according to the analog input signal voltage and the reference voltages given to the differential amplifiers. Referring to this, after the clock signal CLK goes "high" while Vo1−Vob1>0 and Vo2−Vob2>0, the input transistor section performs a predetermined weighting operation to thereby determine the threshold voltage Vtn, and the comparison results obtained by comparing the difference voltage between Vo1 and Vob1 with the difference voltage between Vo2 and Vob2 are output to the positive feedback section and are amplified therethrough, thus outputting Q="high" and QB="low" at the output terminals. Similarly, after the clock signal CLK goes "high" while Vo1−Vob1<0 and Vo2−Vob2<0, the input transistor section performs a predetermined weighting operation to thereby determine the threshold voltage Vtn, and the comparison results obtained by comparing the difference voltage between Vo1 and Vob1 and the difference voltage between Vo2 and Vob2 are output to the positive feedback section and are amplified therethrough, thus outputting Q="low" and QB="high" at the output terminals. If the clock signal CLK is "low", Q=QB="high" is output at the output terminals.

In the comparator 1700 shown in FIG. 17, consider the nodes Va and Vb being the drain voltages of the input transistor section. Vth shown in FIG. 18 is the threshold voltage of the NMOS transistors m11, m12, m21 and m22 of the input transistor section of the comparator.

While Vob1<Vth and Vob2<Vth, the NMOS transistors m21 and m22 are both OFF. Then, even if the clock signal CLK goes "high" and the series of comparison operations of the comparator is completed, since the NMOS transistors m21 and m22 are OFF, the charge stored in the parasitic capacitor of Vb is held therein and the node Vb is not reset to the ground voltage VSS but remains at a high voltage. For the node Va, on the other hand, when the series of comparison operations of the comparator is completed, the output terminal QB goes "low" and the NMOS transistor m1*a* is turned OFF, whereby the current flowing through the node Va becomes substantially zero. Moreover, since the NMOS transistors m11 and m12 is turned ON, the node Va goes "low". Furthermore, even if the clock signal CLK goes "low" while Vob1<Vth and Vob2<Vth, since the NMOS transistors m21 and m22 are both OFF and the NMOS transistors m2*a* and m2*b* are also turned OFF, the node Vb is brought to a high impedance state, whereby the charge stored in the parasitic capacitor of the node Vb is held therein and the node Vb is not reset to the ground voltage VSS but remains at a high voltage. For the node Va, on the other hand, the NMOS transistor m2*a* is turned OFF and the current flowing through the node Va becomes substantially zero. If Vo1>Vth and Vo2>Vth, the NMOS transistors m11 and m12 is turned ON, whereby the node Va goes "low".

Similarly, also when Vo1<Vth and Vo2<Vth, even if the clock signal CLK goes "high" and the series of comparison operations of the comparator is completed, the node Va is not reset to the ground voltage VSS but remains at a high voltage. Moreover, even if the clock signal CLK goes "low", the node Va is not reset to the ground voltage VSS but remains at a high voltage.

When the clock signal CLK goes "low" where the frequency of the clock signal CLK is very low, even if Vob1<Vth and Vob2<Vth and the NMOS transistors m21 and m22 are turned OFF or even if Vo1<Vth and Vo2<Vth and the NMOS transistors m11 and m12 are turned OFF, the charges stored in the nodes Vb and Va escape due to the slight leak current of the transistors, whereby the nodes Vb and Va go "low".

However, as described above, the voltages at the nodes Vb and Va are not reset but remain at a high voltage even if the clock signal CLK goes "low". Then, in order to normally perform a comparison operation, the nodes Vb and Va remaining at a high voltage need to rapidly go back to the steady state at the instance the clock signal CLK goes "high". However, where the frequency of the analog input signal is high, the frequencies of the positive terminal and negative terminal outputs Vo1, Vob1, Vo2 and Vob2 of the first and second differential amplifiers are also naturally high, whereby the nodes Vb and Va cannot go back to the steady state. This serves as a comparator offset, and deteriorates the comparison precision of the comparator, thereby eventually deteriorating the precision of the A/D converter significantly.

The present invention has been made in view of this, and has an object to provide a dynamic-type comparator, in which even if the frequency of the clock signal CLK and the frequency of the analog input signal are high, the nodes Vb and Va are forcibly brought back to the steady state, thereby improving the comparison precision of the comparator.

Means for Solving the Problems

In order to achieve the object set forth above, the present invention provides a dynamic-type comparator, wherein before the start of the comparison operation, even if there is an offset due to a charge remaining at the nodes Vb and Va, the nodes are forcibly reset to a common voltage, thus eliminating the offset.

Specifically, the present invention provides a comparator for receiving a plurality of differential voltage pairs and performing a comparison operation, in synchronism with a clock signal, on each difference voltage of the plurality of differential voltage pairs, including: an input transistor section for receiving the plurality of differential voltage pairs and performing a predetermined weighting operation and a voltage-current conversion operation on the plurality of differential voltage pairs, thus performing a differential comparison operation on each difference voltage of the plurality of weighted differential voltage pairs, and outputting a differential current pair being a result of the differential comparison; a positive feedback section for receiving the differential comparison result from the input transistor section and, in synchronism with the clock signal, amplifying the received differential comparison result to a predetermined voltage level to output the amplified result as a comparison result of the comparator, when the clock signal is at a predetermined level; and a reset section for resetting both of two connecting portions between the input transistor section and the positive feedback section to a predetermined reset voltage when the clock signal is not at the predetermined level, wherein: the reset section includes a reset voltage generator for generating the predetermined reset voltage; the reset voltage generator includes a replica circuit including at least one circuit portion of a differential pair of a circuit identical to a circuit formed by the input transistor section and the positive feedback section; and the reset voltage generator outputs, as the predetermined reset voltage, a voltage at a connecting portion between the input transistor section and the positive feedback section of the replica circuit.

The present invention provides a comparator as set forth above, wherein the predetermined reset voltage used in the reset operation by the reset section is a ground voltage.

The present invention provides a comparator for receiving a plurality of differential voltage pairs and performing a comparison operation, in synchronism with a clock signal, on each difference voltage of the plurality of differential voltage pairs, including: an input transistor section for receiving the plurality of differential voltage pairs and performing a predetermined weighting operation and a voltage-current conversion operation on the plurality of differential voltage pairs, thus performing a differential comparison operation on each difference voltage of the plurality of weighted differential voltage pairs, and outputting a differential current pair being a result of the differential comparison; a positive feedback section including a pair of feedback transistors for receiving the differential comparison result from the input transistor section and, in synchronism with the clock signal, amplifying the received differential comparison result to a predetermined voltage level to output the amplified result as a comparison result of the comparator, when the clock signal is at a predetermined level; and a pair of switch transistors each being connected in series with one of the pair of feedback transistors of the positive feedback section, wherein the switch transistors are switched by the clock signal to allow or prohibit an operation of the positive feedback section; and a reset section for resetting both of two connecting portions between the pair of feedback transistors of the positive feedback section and the pair of switch transistors to a predetermined reset voltage when the clock signal is not at the predetermined level, wherein: the reset section includes a reset voltage generator for generating the predetermined reset voltage; the reset voltage generator includes a replica circuit including at least one circuit portion of a differential pair of a circuit identical to a circuit formed by the input transistor section, the positive feedback section and the pair of switch transistors; and the reset voltage generator outputs, as the predetermined reset voltage, a voltage at a connecting portion between the feedback transistor of the positive feedback section and the switch transistor of the replica circuit.

The present invention provides a comparator as set forth above, wherein the predetermined reset voltage used in the reset operation by the reset section is a ground voltage.

The present invention provides a comparator as set forth above, wherein: the reset section is given an inverted signal of the clock signal which is given to the positive feedback section; and a delay circuit is provided for delaying the inverted signal of the clock signal given to the reset section by a predetermined amount of time.

The present invention provides an A/D converter for performing an A/D conversion by using a comparator as set forth above.

Thus, according to the present invention, before the start of the comparison operation, even if there is an offset due to a charge remaining at one of two predetermined nodes inside the comparator, both nodes are forcibly reset by the reset section to a common reset voltage, thus eliminating the offset and thereby improving the comparison precision of the comparator.

EFFECTS OF THE INVENTION

As described above, according to the present invention, the comparison precision does not deteriorate even if the frequency of the clock signal and the frequency of the analog input signal are high. Therefore, it is possible to expand the frequency of the clock signal and the frequency of the analog input signal.

DESCRIPTION OF REFERENCE NUMERALS

10 Input transistor section
11 Positive feedback section
12 Reset section
100 Comparator
400 Comparator
500 Comparator
600 Vreset generator (reset voltage generator)
700 Comparator
800 Comparator
900 Comparator
1000 Vreset generator
1100 Inverted clock generation circuit (delay circuit)
1300 A/D converter
1301 Reference voltage generation circuit
1301a High voltage-side reference voltage
1301b Low voltage-side reference voltage
1302 Chain of differential amplifiers
1304 Chain of comparators
1305 Encoder circuit

BEST MODE FOR CARRYING OUT THE INVENTION

Specific embodiments of the comparator and the A/D converter of the present invention will now be described in detail with reference to the drawings.

Embodiment 1

Figure 1:
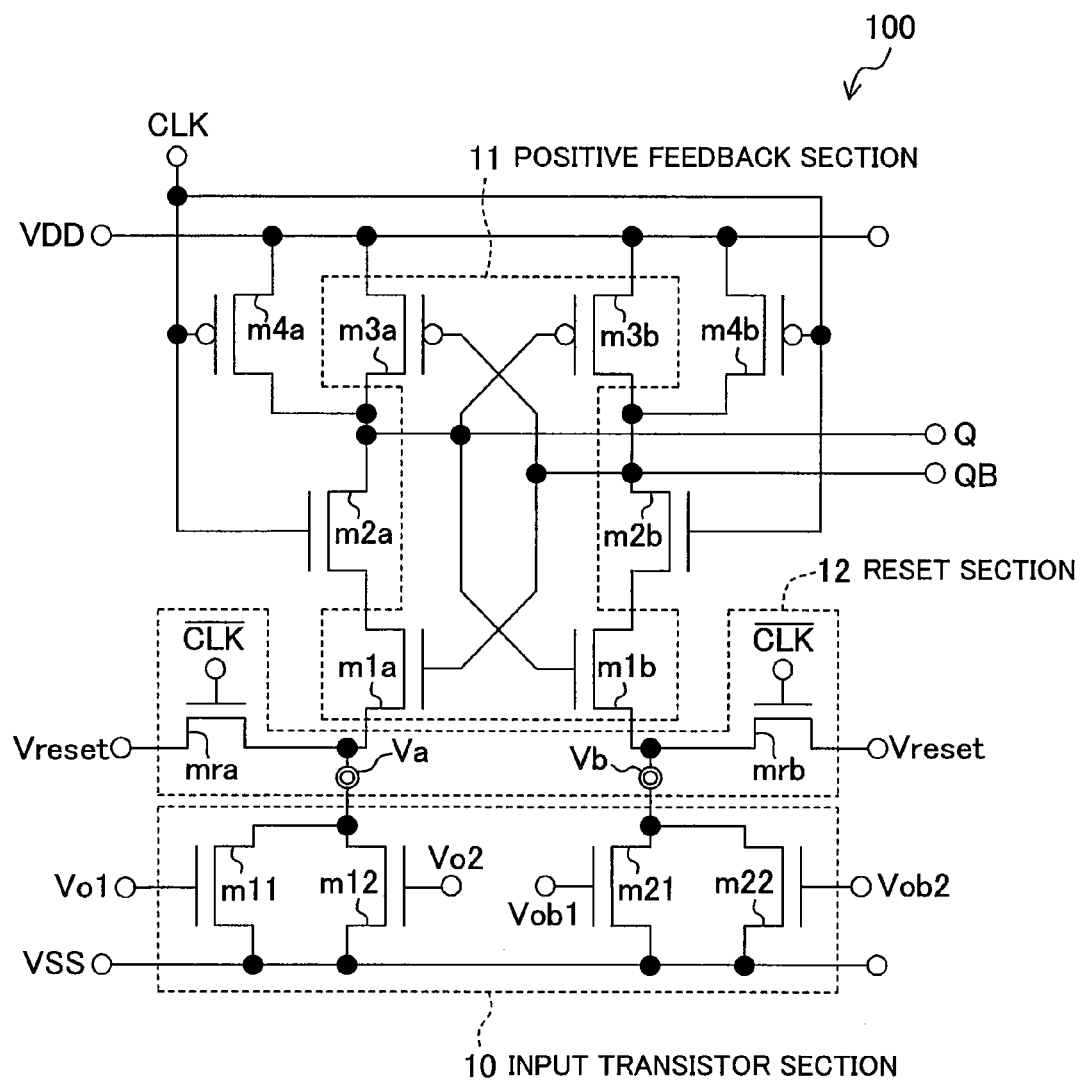
FIG. 1 shows a specific configuration of a comparator of Embodiment 1.

FIG. 1 shows an exemplary configuration of a dynamic-type comparator 100 of Embodiment 1.

Referring to the figure, the comparator 100 includes an input transistor section 10 including NMOS transistors m11, m12, m21 and m22, and a positive feedback section (cross-coupled inverter latch section) 11 including NMOS transistors m1a and m1b and PMOS transistors m3a and m3b, wherein an output terminal QB is connected to the gate terminals of m1a and m3a and the drain terminal of m3b of the positive feedback section 11, and an output terminal Q is connected to the gate terminals of the transistors m1b and m3b and the drain terminal of the transistor m3a of the positive feedback section 11. Referring to FIG. 1, an NMOS transistor m2a functioning as a switch in synchronism with the clock signal CLK is connected between the drain terminal of the NMOS transistor m1a and the drain terminal of the PMOS transistor m3a, and an NMOS transistor m2b functioning as a switch in synchronism with CLK is connected between the drain terminal of the NMOS transistor m1b and the drain terminal of the PMOS transistor m3b. The source terminals of the PMOS transistors m3a and m3b are connected to the power supply VDD. A PMOS transistor m4a functioning as a switch in synchronism with the clock signal CLK is connected between the drain terminal of the PMOS transistor m3a and the power supply VDD, and a PMOS transistor m4b functioning as a switch in synchronism with the clock signal CLK is connected between the drain terminal of the PMOS transistor m3b and the power supply VDD. The positive terminal output Vo1 and the negative terminal output Vob1 of the first differential amplifier and the positive terminal output Vo2 and the negative terminal output Vob2 of the second differential amplifier are connected to the gate terminals of the NMOS transistors m11, m21, m12 and m22, respectively, of the input transistor section 10, and the reference ground potential VSS is connected to the source terminal thereof. The drain terminals of the NMOS transistors m11 and m12 are connected to the source terminal of the NMOS transistor m1a (the node Va), and the drain terminals of the NMOS transistors m21 and m22 are connected to the source terminal of the NMOS transistor m1b (the node Vb). The gate terminals of the NMOS switch transistors m2a and m2b functioning as switches in synchronism with the clock signal CLK and the gate terminals of the PMOS switch transistors m4a and m4b functioning as switches in synchronism with the clock signal CLK are connected to the clock signal CLK. Furthermore, an NMOS transistor mra functioning as a reset transistor is connected between the node Va and the reset voltage input terminal Vreset, an NMOS transistor mrb functioning as a reset transistor is connected between the node Vb and the reset voltage input terminal Vreset. These reset transistors mra and mrb together form a reset section 12, and the inverted signal /CLK of the clock signal is connected to the gate terminals of these reset transistors mra and mrb. This is the configuration of the dynamic-type comparator 100 of Embodiment 1.

Next, referring to FIGS. 1 and 2, a series of operations of the dynamic-type comparator 100 of Embodiment 1 will be described.

Figure 2:
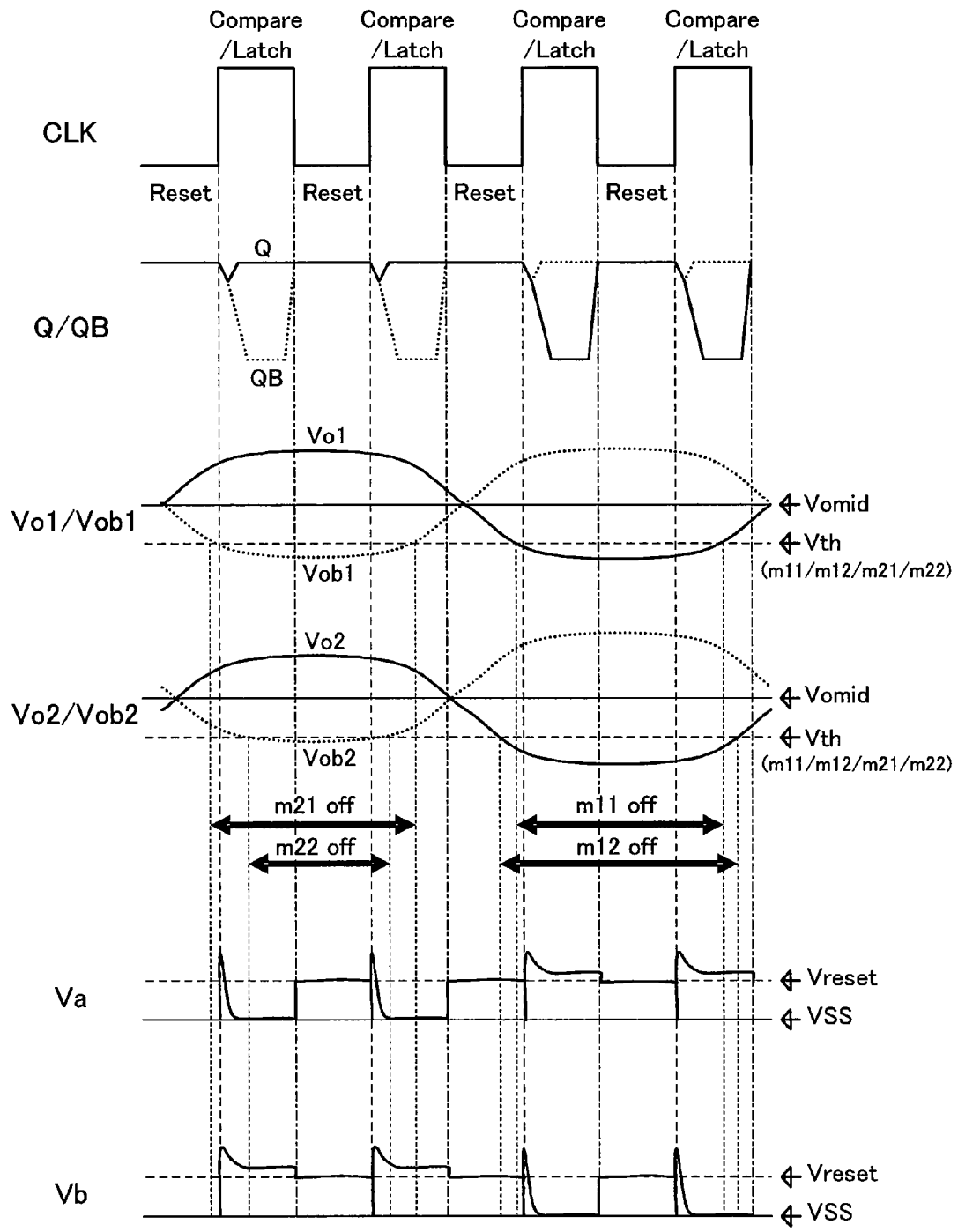
FIG. 2 shows a timing diagram of the comparator.

FIG. 2 shows a timing diagram of the clock signal CLK, the output terminals Q and QB of the comparator 100, the positive terminal output Vo1 and the negative terminal output Vob1 of the first differential amplifier, the positive terminal output Vo2 and the negative terminal output Vob2 of the second differential amplifier, and the voltages at the nodes Va and Vb of the comparator 100.

When the clock signal CLK is "low", the NMOS transistors m2a and m2b are turned OFF and the PMOS transistors m4a and m4b are turned ON. Then, the positive feedback section 11 is no longer operative, and the output terminals Q and QB are pulled up to "high". At this point, since the NMOS transistors m2a and m2b are OFF, no current flows through this circuit. On the other hand, the inverted signal /CLK of the clock signal goes "high", and the NMOS transistors mra and mrb are turned ON, thus electrically connecting the nodes Va and Vb with the reset voltage input terminal Vreset. This function is effective even if both of the positive terminal outputs Vo1 and Vo2 of the first and second differential amplifiers or both of the negative terminal outputs Vob1 and Vob2 of the first and second differential amplifiers are below the threshold voltage Vth of the input transistor section 10, and both of the NMOS transistors m11 and m12 of the input transistor section 10 or both of the NMOS transistors m21 and m22 are turned OFF. Therefore, the voltages at the nodes Va and Vb are reset to the predetermined reset voltage Vreset (the Reset state).

When the clock signal CLK is "high" (predetermined level), the NMOS transistors m2a and m2b are turned ON and the PMOS transistors m4a and m4b are turned OFF. Thus, the positive feedback section 11 becomes operative. The NMOS transistors m11, m12, m21 and m22 of the input transistor section 10 perform a predetermined weighting operation to thereby determine the threshold voltage Vtn, and performs a differential comparison between the difference voltage between the difference voltage between the positive terminal output voltage Vo1 and the negative terminal output voltage Vob1 of the first differential amplifier and the difference voltage between the second differential amplifier and the positive terminal output voltage Vo2, to output, to the positive feedback section 11, a differential current pair flowing through the nodes Va and Vb as the results of the differential comparison.

The predetermined weighting operation can be realized by, for example, setting the size ratio of the gate width W of the transistors of the input transistor section 10 to a fixed value. For example, the threshold voltage Vtn can be obtained by setting the size ratio of the gate width W between the transistors m11 and m12 to 1:3 and the size ratio of the gate width W between the transistors m12 and m22 to 1:3. Any method may be used for realizing the predetermined weighting operation as described above. For example, similar effects can be obtained also when the predetermined weighting operation is realized by setting an equal gate width W for the transistors of the input transistor section 10 and setting the ratio of the gate length L thereof to a fixed value. Alternatively, similar effects can be obtained also when the predetermined weighting operation is realized by setting an equal gate width W and an equal gate length L for the transistors of the input transistor section 10 and setting the ratio of the number of transistors connected in parallel to a fixed value. The drain currents of the NMOS transistors m11, m12, m21 and m22 of the input transistor section 10 vary depending on the gate terminal voltages thereof. Therefore, a drain voltage VDS1 occurs according to the gate terminal voltage of the transistors m11 and m12, and a drain voltage VDS2 occurs according to the gate terminal voltage of the transistors m21 and m22. The positive feedback section 11 positively feeds back the difference voltage between these drain voltages VDS1 and VDS2, and the positive feedback section 11 amplifies it to a predetermined voltage level being the power supply voltage VDD, i.e., "high", or the reference ground voltage VSS, i.e., "low", and stores the amplified state (the Compare & Latch state). While a current flows through this circuit during a period in which the output terminals Q and QB of the comparator are transitioning, no current flows through this circuit when the transition of the output terminals Q and QB is completed to enter Latch State. For example, where VDS1>VDS2, the output terminal Q of the comparator is amplified to "high" and the output terminal QB is amplified to "low" by positively feeding back the difference voltage. On the other hand, the inverted signal /CLK of the clock signal goes "low" and the NMOS transistors mra and mrb are turned OFF, thus disconnecting the nodes Va and Vb from the reset voltage input terminal Vreset.

The NMOS transistors m11, m12, m21 and m22 of the input transistor section 10 start operating in the linear region at the instance the clock signal CLK goes "high". Where the transistors m11, m12, m21 and m22 have a constant gate length L, gate widths W1, W2, W1 and W2, respectively, a threshold voltage Vth, a carrier mobility μn, a gate capacitance Cox, and gate terminal-source terminal voltages Vgs11 (=Vo1), Vgs12 (=Vo2), Vgs21 (=Vob1) and Vgs22 (=Vob2), respectively, their drain conductances G11, G12, G21 and G22 can be expressed as follows.

$$G11 = \mu n \cdot Cox \cdot (W1/L)(Vo1 - Vth - VDS1) \quad (1.1)$$

$$G12 = \mu n \cdot Cox \cdot (W2/L)(Vo2 - Vth - VDS1) \quad (1.2)$$

$$G21 = \mu n \cdot Cox \cdot (W1/L)(Vob1 - Vth - VDS2) \quad (1.3)$$

$$G22 = \mu n \cdot Cox \cdot (W2/L)(Vob2 - Vth - VDS2) \quad (1.4)$$

The threshold voltage of the comparator 100 shown in FIG. 1 is obtained when the positive feedback section 11 is insensitive, i.e., $$VDS1 = VDS2(=VDS).$$

Therefore, when the sum of the drain conductances G11 and G12 of the transistors m11 and m12 is equal to the sum of the drain conductances G21 and G22 of the transistors m21 and m22, the following hold true.

$$G11 + G12 = G21 + G22$$

$$\mu n \cdot Cox \cdot ((W1/L)(Vo1 - Vth - VDS1) + (W2/L)(Vo2 - Vth - VDS1)) = \mu n \cdot Cox \cdot ((W1/L)(Vob1 - Vth - VDS2) + (W2/L)(Vob2 - Vth - VDS2))$$

$$W1(Vo1 - Vth - VDS) + W2(Vo2 - Vth - VDS) = W1(Vob1 - Vth - VDS) + W2(Vob2 - Vth - VDS)$$

$$W1 \cdot Vo1 + W2 \cdot Vo2 = W1 \cdot Vob1 + W2 \cdot Vob2 \quad (1.5)$$

Assuming herein that the size ratio between the gate widths W1 and W2 is $$W1:W2 = n/m:(m-n)/m \quad (1.6)$$

the following holds true.

$$(n \cdot Vo1 + (m-n) \cdot Vo2)/m = (n \cdot Vob1 + (m-n) \cdot Vob2)/m \quad (1.7)$$

Figure 3:
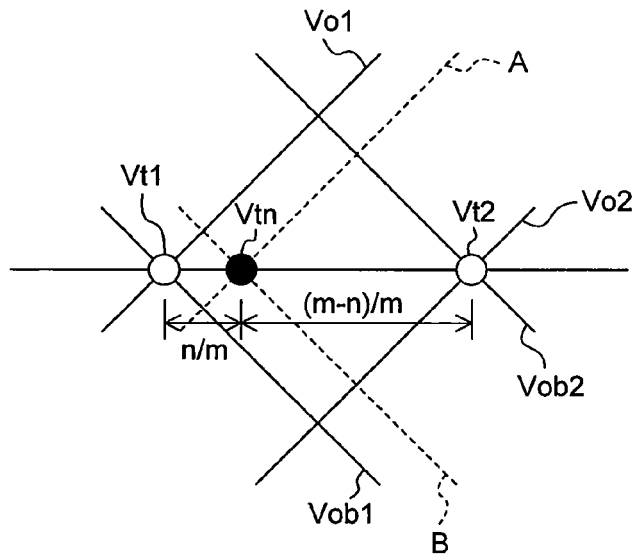
FIG. 3 shows the relationship between the input signal loci and the comparator threshold voltage of the comparator.

This will now be described in greater detail with reference to FIG. 3. FIG. 3 shows the loci of the input signals of the comparator 100, i.e., the positive terminal output voltage Vo1 and the negative terminal output voltage Vob1 of the first differential amplifier and the positive terminal output voltage Vo2 and the negative terminal output voltage Vob2 of the second differential amplifier, and the threshold voltage. The broken line A of FIG. 3 represents the locus of the left side of Expression (1.7), being a division between Vo1 and Vo2 at n:m−n. Similarly, the broken line B represents the locus of the right side of Expression (1.7), being a division between Vob1 and Vob2 at n:m−n. The intersection Vtn between the broken line A and the broken line B represents the threshold voltage of the comparator 100. Herein, the intersection Vtn is a division between the intersection Vt1 between Vo1 and Vob1 and the intersection Vt2 between Vo2 and Vob2 at n:m−n. Thus, by setting the gate size ratio between the NMOS transistors (m11, m21) and (m12, m22) of the input transistor section 10 to n/m:(m−n)/m, it is possible to obtain the threshold voltage Vtn lying at the n-th one of m segments into which the interval between the intersection Vt1 and the intersection Vt2 is divided.

This is the description of the series of operations of the dynamic-type comparator 100 of Embodiment 1.

As described above, the dynamic-type comparator 100 of Embodiment 1 has a function of resetting the nodes Va and Vb to the predetermined reset voltage Vreset by using the reset transistors mra and mrb operating in synchronism with the inverted signal of the clock signal in the Reset state, whereby it is possible to desirably ensure the comparison precision even if the clock signal frequency and the analog input signal frequency are high.

Embodiment 2

Figure 4:
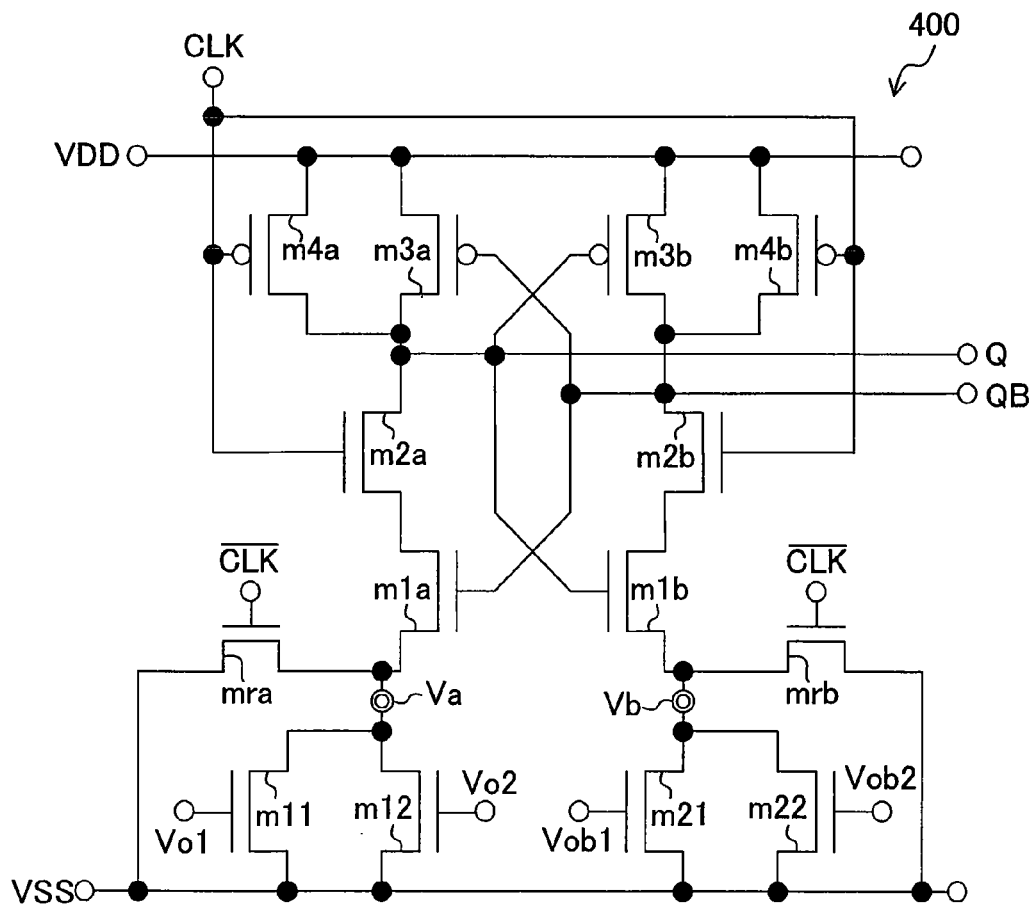
FIG. 4 shows a specific configuration of a comparator of Embodiment 2.

FIG. 4 shows an exemplary configuration of a dynamic-type comparator 400 of Embodiment 1. The comparator 400 includes an input transistor section including NMOS transistors m11, m12, m21 and m22, and a positive feedback section (cross-coupled inverter latch section) including NMOS transistors m1a and m1b and PMOS transistors m3a and m3b, wherein an output terminal QB is connected to the gate terminals of the transistors m1a and m3a and the drain terminal of the transistor m3b of the positive feedback section, and an output terminal Q is connected to the gate terminals of the transistors m1b and m3b and the drain terminal of the transistor m3a of the positive feedback section. An NMOS transistor m2a functioning as a switch in synchronism with the clock signal CLK is connected between the drain terminal of the NMOS transistor m1a and the drain terminal of the PMOS transistor m3a, and an NMOS transistor m2b functioning as a switch in synchronism with CLK is connected between the drain terminal of the NMOS transistor m1b and the drain terminal of the PMOS transistor m3b. The source terminals of the PMOS transistors m3a and m3b are connected to the power supply VDD. A PMOS transistor m4a functioning as a switch in synchronism with the clock signal CLK is connected between the drain terminal of the PMOS transistor m3a and the power supply VDD, and a PMOS transistor m4b functioning as a switch in synchronism with CLK is connected between the drain terminal of the PMOS transistor m3b and the power supply VDD. The positive terminal output Vo1 and the negative terminal output Vob1 of the first differential amplifier and the positive terminal output Vo2 and the negative terminal output Vob2 of the second differential amplifier are connected to the gate terminals of the NMOS transistors m11, m21, m12 and m22, respectively, of the input transistor section, and the reference ground potential VSS is connected to the source terminal thereof. The drain terminals of the transistors m1 and m12 are connected to the source terminal of the transistor m1a (the node Va), and the drain terminals of the transistors m21 and m22 are connected to the source terminal of the transistor m1b (Vb).

Moreover, the gate terminals of the NMOS transistors m2a and m2b functioning as switches in synchronism with the clock signal CLK and the gate terminals of the PMOS transistors m4a and m4b functioning as switches in synchronism with the clock signal CLK are connected to the clock signal CLK. Furthermore, an NMOS transistor mra functioning as a reset transistor is connected between the node Va and the ground voltage VSS, an NMOS transistor mrb functioning as a reset transistor is connected between Vb and the ground voltage VSS, and the inverted signal /CLK of the clock signal is connected to the gate terminals of the NMOS transistors mra and mrb functioning as reset transistors. This is the exemplary configuration of the dynamic-type comparator 400 of Embodiment 2.

Next, referring to FIG. 4, a series of operations of the dynamic-type comparator 400 of Embodiment 2 will be described.

Basically, the series of operations of the dynamic-type comparator 400 of Embodiment 2 is substantially equal to the series of operations of the dynamic-type comparator 100 of Embodiment 1. A difference is the operation in the Reset state where the clock signal CLK is "low" to be described below.

When the clock signal CLK is "low", the NMOS transistors m2a and m2b are turned OFF and the PMOS transistors m4a and m4b are turned ON. Then, the positive feedback section Q is no longer operative, and the output terminals QB and High are pulled up to "high". At this point, since the transistors m2a and m2b are OFF, no current flows through this circuit. On the other hand, the inverted signal /CLK of the clock signal goes "high", and the NMOS transistors mra and mrb are turned ON, thus electrically connecting the nodes Va and Vb with the ground voltage VSS. This function is effective even if both of Vo1 and Vo2 or both of Vob1 and Vob2 are below the threshold voltage Vth of the input transistor section, and both of the NMOS transistors m11 and m12 of the input transistor section or both of the transistors m21 and m22 are turned OFF. Therefore, the voltages at the nodes Va and Vb are reset to the ground voltage VSS (the Reset state).

When the clock signal CLK is "high", the NMOS transistors m2a and m2b are turned ON and the PMOS transistors m4a and m4b are turned OFF. Thus, the positive feedback section becomes operative. The NMOS transistors m11, m12, m21 and m22 of the input transistor section perform a predetermined weighting operation to thereby determine the threshold voltage Vtn, and outputs, to the positive feedback section, the results of a comparison between the difference voltage between the positive terminal output voltage Vo1 and the negative terminal output voltage Vob1 of the first differential amplifier and the difference voltage between the second differential amplifier and the positive terminal output voltage Vo2. The realization of the predetermined weighting operation has already been described in Embodiment 1, and will not be further described below. The drain currents of the transistors m11, m12, m21 and m22 of the input transistor section vary depending on the gate terminal voltages thereof. Therefore, a drain voltage VDS1 occurs according to the gate terminal voltage of the transistors m11 and m12, and a drain voltage VDS2 occurs according to the gate terminal voltage of the transistors m21 and m22. The positive feedback section positively feeds back the difference voltage between VDS1 and VDS2, and the positive feedback section amplifies it to the power supply voltage VDD, i.e., "high", or the reference ground voltage VSS, i.e., "low", and stores the amplified state (the Compare & Latch state). While a current flows through this circuit during a period in which the output terminals Q and QB of the comparator are transitioning, no current flows through this circuit when the transition of the output terminals Q and QB is completed to enter Latch State. For example, where VDS1>VDS2, the output terminal Q of the comparator is amplified to "high" and the output terminal QB is amplified to "low" by positively feeding back the difference voltage. On the other hand, the inverted signal /CLK of the clock signal goes "low" and the NMOS transistors mra and mrb are turned OFF, thus disconnecting the nodes Va and Vb from the reference ground voltage VSS.

Other than this, the principle of the circuit operation is equal to that of the dynamic-type comparator 100 of Embodiment 1.

This is the description of the series of operations of the dynamic-type comparator 400 of Embodiment 2.

As described above, the dynamic-type comparator 400 of Embodiment 2 has a function of resetting the nodes Va and Vb to the ground voltage VSS by using switches operating in synchronism with the inverted signal of the clock signal in the Reset state, whereby it is possible to reduce the deterioration of the comparison precision occurring when the clock signal frequency and the analog input signal frequency are high, which is a problem with conventional techniques. The comparator differs from the comparator 100 in that the reset voltage input terminal Vreset is not needed and the voltages at the nodes Va and Vb in the Reset state are not Vreset but the ground voltage VSS.

Embodiment 3

Figure 5:
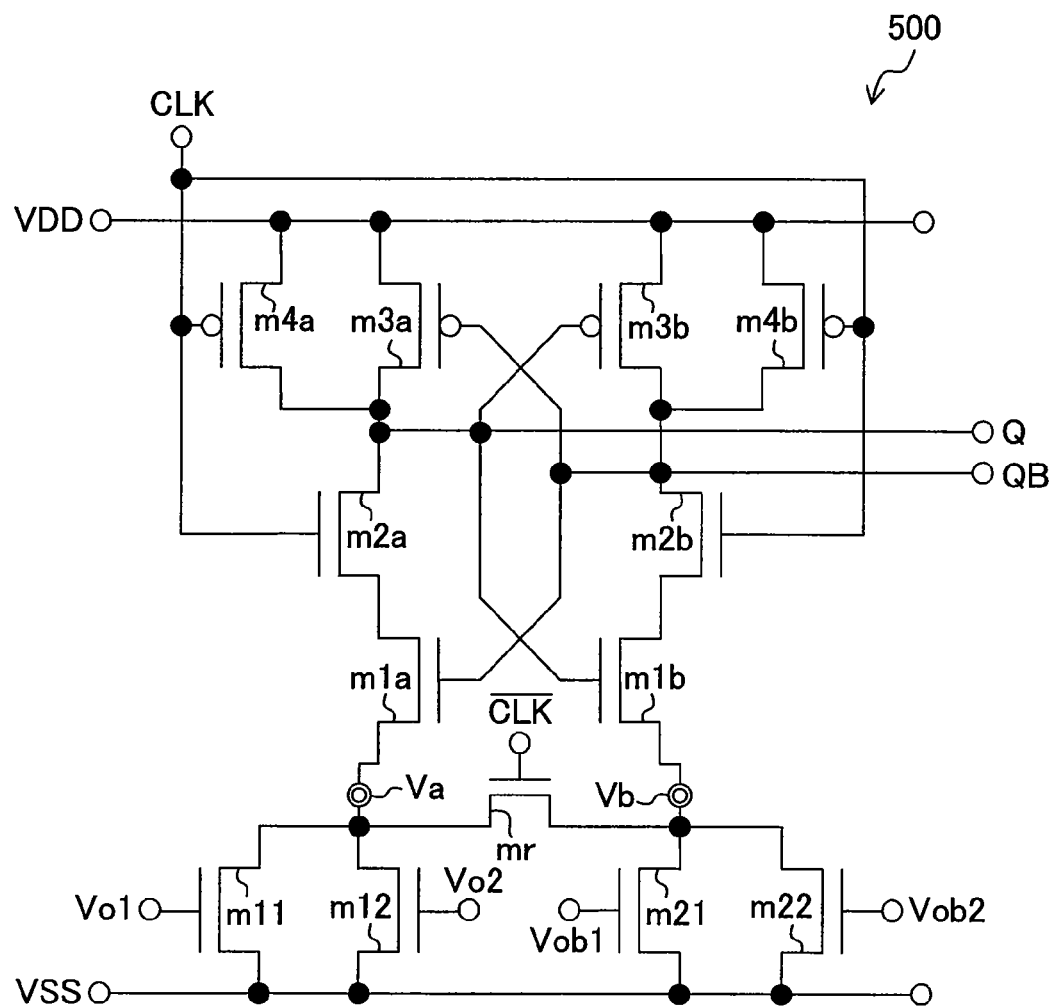
FIG. 5 shows a specific configuration of a comparator of Embodiment 3.

FIG. 5 shows an exemplary configuration of a dynamic-type comparator 500 of Embodiment 3. The comparator 500 includes an input transistor section including NMOS transistors m11, m12, m21 and m22, and a positive feedback section (cross-coupled inverter latch section) including NMOS transistors m1a and m1b and PMOS transistors m3a and m3b, wherein an output terminal QB is connected to the gate terminals of the transistors m1a and m3a and the drain terminal of the transistor m3b of the positive feedback section, and an output terminal Q is connected to the gate terminals of the transistors m1b and m3b and the drain terminal of the transistor m3a of the positive feedback section. An NMOS transistor m2a functioning as a switch in synchronism with the clock signal CLK is connected between the drain terminal of the NMOS transistor m1a and the drain terminal of the PMOS transistor m3a, and an NMOS transistor m2b functioning as a switch in synchronism with CLK is connected between the drain terminal of the NMOS transistor m1b and the drain terminal of the PMOS transistor m3b. The source terminals of the PMOS transistors m3a and m3b are connected to the power supply VDD. A PMOS transistor m4a functioning as a switch in synchronism with the clock signal CLK is connected between the drain terminal of the PMOS transistor m3a and the power supply VDD, and a PMOS transistor m4b functioning as a switch in synchronism with CLK is connected between the drain terminal of the PMOS transistor m3b and the power supply VDD. The positive terminal output Vo1 and the negative terminal output Vob1 of the first differential amplifier and the positive terminal output Vo2 and the negative terminal output Vob2 of the second differential amplifier are connected to the gate terminals of the NMOS transistors m11, m21, m12 and m22, respectively, of the input transistor section, and the reference ground potential VSS is connected to the source terminal thereof. The drain terminals of the transistors m11 and m12 are connected to the source terminal of m1a (the node Va), and the drain terminals of the transistors m21 and m22 are connected to the source terminal of the transistor m1b (Vb). The gate terminals of the NMOS transistors m2a and m2b functioning as switches in synchronism with the clock signal CLK and the gate terminals of the PMOS transistors m4a and m4b functioning as switches in synchronism with the clock signal CLK are connected to the clock signal CLK. Furthermore, an NMOS transistor mr functioning as a reset transistor is connected between the two nodes (connecting portions) Va and Vb, and the inverted signal /CLK of the clock signal is connected to the gate terminal of the NMOS transistor mr functioning as a reset transistor. This is the exemplary configuration of the dynamic-type comparator 500 of Embodiment 3.

Next, referring to FIG. 5, a series of operations of the dynamic-type comparator 500 of Embodiment 3 will be described.

Basically, the series of operations of the dynamic-type comparator 500 of Embodiment 3 is substantially equal to the series of operations of the dynamic-type comparator 100 of Embodiment 1. A difference is the operation in the Reset state where the clock signal CLK is "low" to be described below.

When the clock signal CLK is "low", the NMOS transistors m2a and m2b are turned OFF and the PMOS transistors m4a and m4b are turned ON. Then, the positive feedback section is no longer operative, and the output terminals Q and QB are pulled up to "high". At this point, since the transistors m2a and m2b are OFF, no current flows through this circuit. On the other hand, the inverted signal /CLK of the clock signal goes "high", and the NMOS transistor mr is turned ON, thus shorting and electrically connecting together the two nodes Va and Vb. This function is effective even if both of Vo1 and Vo2 or both of Vob1 and Vob2 are below the threshold voltage Vth of the input transistor section, and both of the NMOS transistors m11 and m12 of the input transistor section or both of the transistors m21 and m22 are turned OFF. Therefore, the voltages at the nodes Va and Vb are reset to the same potential. Assuming that no current is flowing through this circuit and one or more of the transistors m11, m12, m21 and m22 are ON, the nodes Va and Vb are reset to the ground voltage VSS (the Reset state).

When the clock signal CLK is "high", the NMOS transistors m2a and m2b are turned ON and the PMOS transistors m4a and m4b are turned OFF. Thus, the positive feedback section becomes operative. The NMOS transistors m11, m12, m21 and m22 of the input transistor section perform a predetermined weighting operation to thereby determine the threshold voltage Vtn, and outputs, to the positive feedback section, the results of a comparison between the difference voltage between the positive terminal output voltage Vo1 and the negative terminal output voltage Vob1 of the first differential amplifier and the difference voltage between the second differential amplifier and the positive terminal output voltage Vo2. The realization of the predetermined weighting operation has already been described, and will not be further described below. The drain currents of the transistors m11, m12, m21 and m22 of the input transistor section vary depending on the gate terminal voltages thereof. Therefore, a drain voltage VDS1 occurs according to the gate terminal voltage of the transistors m11 and m12, and a drain voltage VDS2 occurs according to the gate terminal voltage of the transistors m21 and m22. The positive feedback section positively feeds back the difference voltage between VDS1 and VDS2, and the positive feedback section amplifies it to the power supply voltage VDD, i.e., "high", or the reference ground voltage VSS, i.e., "low", and stores the amplified state (the Compare & Latch state). While a current flows through this circuit during a period in which the output terminals Q and QB of the comparator are transitioning, no current flows through this circuit when the transition of the output terminals Q and QB is completed to enter Latch State. For example, where VDS1>VDS2, the output terminal Q of the comparator is amplified to "high" and the output terminal QB is amplified to "low" by positively feeding back the difference voltage. On the other hand, the inverted signal /CLK of the clock signal goes "low" and the NMOS transistor mr is turned OFF, thus disconnecting the nodes Va and Vb.

Other than this, the principle of the circuit operation is equal to that of the dynamic-type comparator 100 of Embodiment 1.

This is the description of the series of operations of the dynamic-type comparator 500 of Embodiment 3.

As described above, the dynamic-type comparator 500 of Embodiment 3 has a function of resetting the nodes Va and Vb to the same potential by using switches operating in synchronism with the inverted signal of the clock signal in the Reset state, whereby it is possible to reduce the deterioration of the comparison precision occurring when the clock signal frequency and the analog input signal frequency are high, which is a problem with conventional techniques. The comparator differs from the comparator 100 in that the reset voltage input terminal Vreset is not needed, and the voltages at the nodes Va and Vb in the Reset state are not Vreset but the nodes Va and Vb are at the same potential, or the voltages at the nodes Va and Vb are the ground voltage VSS if any of the transistors m11, m12, m21 and m22 is ON in the Reset state. The comparator differs from the comparator 400 in that the configuration can be realized with one less reset transistors.

Embodiment 4

Figure 6:
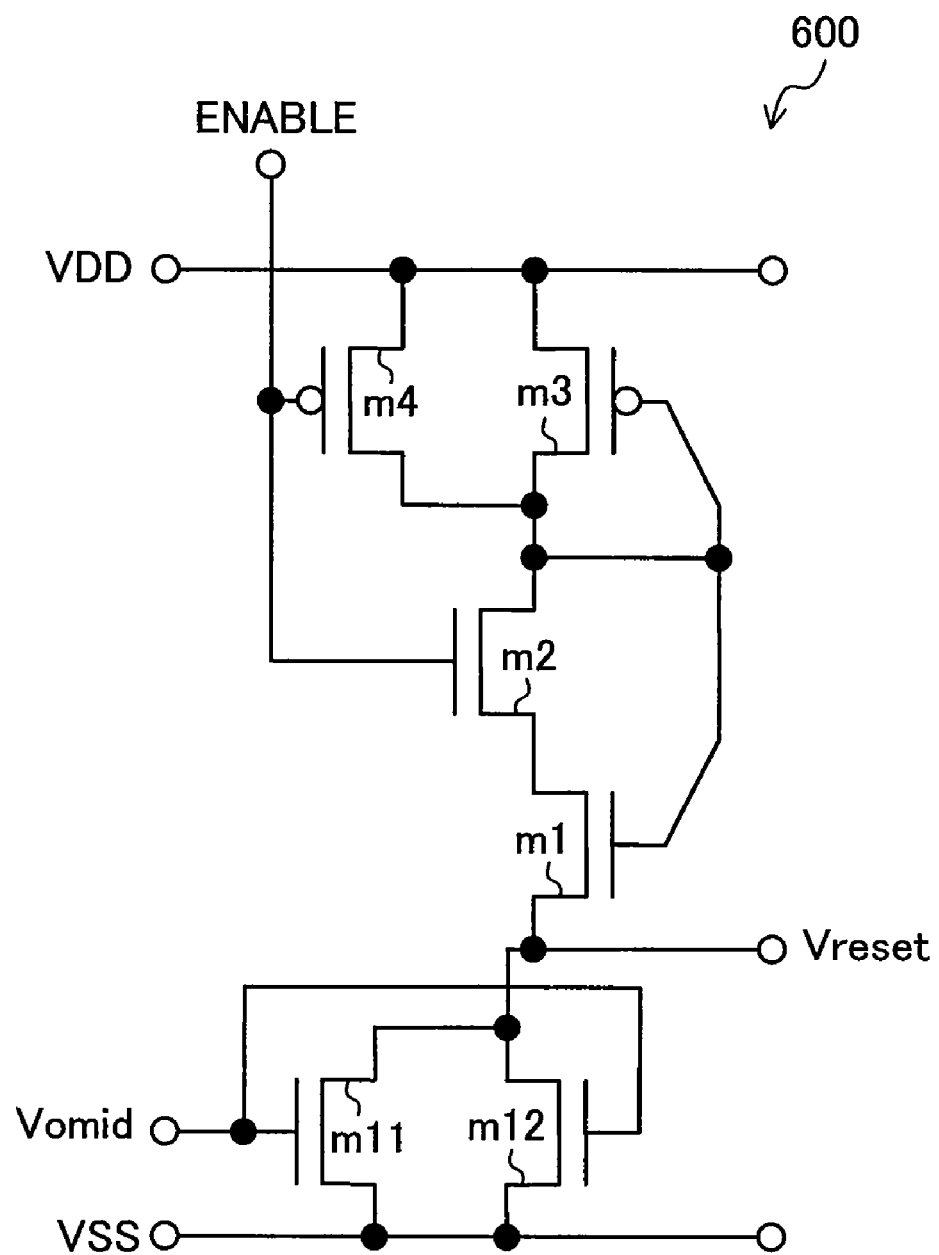
FIG. 6 shows a specific configuration of a Vreset generator in a comparator of Embodiment 4.

FIG. 6 shows an exemplary configuration of a Vreset generator (reset voltage generator) 600 of Embodiment 4 for the dynamic-type comparator 100 of Embodiment 1. The Vreset generator 600 is a half circuit of the comparator 100, and is configured as a replica circuit of the comparator 100. It includes an input transistor section including NMOS transistors m11 and m12, and an NMOS transistor m1 and a PMOS transistor m3 being a half circuit of the positive feedback section of the comparator 100, wherein the gate terminals of the transistors m1 and m3 and the drain terminal of the transistor m3 are connected to each other. An NMOS transistor m2 functioning as a switch in synchronism with the Vreset generator activation signal ENABLE is connected between the drain terminal of the NMOS transistor m1 and the drain terminal of the PMOS transistor m3. The source terminal of the PMOS transistor m3 is connected to the power supply VDD. A PMOS transistor m4 functioning as a switch in synchronism with the Vreset generator activation signal ENABLE is connected between the drain terminal of the PMOS transistor m3 and the power supply VDD. The common mode voltage Vomid between the positive terminal output and the negative terminal output of the differential amplifier is connected to the gate terminals of the NMOS transistors m11 and m12 of the input transistor section, the reference ground voltage VSS is connected to the source terminal thereof, and the voltage at the connecting point between the input transistor section 10 and the positive feedback section 11, i.e., the connecting portion between the drain terminals of the NMOS transistors m11 and m12 and the source terminal of the feedback transistor m1, is externally output as the reset voltage Vreset. The gate terminal of the NMOS transistor m2 functioning as a switch in synchronism with the Vreset generator activation signal ENABLE and the gate terminal of the PMOS transistor m4 functioning as a switch in synchronism with the Vreset generator activation signal ENABLE are connected to the Vreset generator activation signal ENABLE. This is the exemplary configuration of the Vreset generator 600 of Embodiment 4 for the dynamic-type comparator 100 of Embodiment 1.

Next, referring to FIG. 6, a series of operations of the Vreset generator 600 of Embodiment 4 will be described.

When the Vreset generator activation signal ENABLE is "low", the NMOS transistor m2 is turned OFF and the PMOS transistor m4 is turned ON. Then, the half circuit of the positive feedback section of the comparator 100 is no longer operative, whereby the gate terminal voltage of the transistor m3 is pulled up to "high", and the reset voltage Vreset converges to "low". At this point, since the transistor m2 is OFF, no current flows through this circuit.

When the Vreset generator activation signal ENABLE is "high", the NMOS transistor m2 is turned ON and the PMOS transistor m4 is turned OFF. Thus, the half circuit of the positive feedback section of the comparator 100 becomes operative. It is assumed that the NMOS transistors m11 and m12 of the input transistor section have a predetermined size ratio. For example, the size ratio of the gate width W between the transistor m11 and the transistor m12 is set to (m/2)/m: (m/2)/m as in Expression (1.6). As described above in the description of the operation of Embodiment 1 of the present invention, any method may be used for realizing the predetermined size ratio. In this case, the gate terminal-source terminal voltage of the transistor m11 and the transistor m12 is Vomid, and a certain constant drain current flows from the transistors m11 and m12 to this circuit according to Vomid. The combined current of the drain currents of the transistors m11 and m12 flows through the transistors m3 and m2 and m1. This is used as the Vreset generator activation current. The transistor m3, being in a diode connection where the gate terminal and the drain terminal thereof are connected to each other, operates as a resistor having a certain constant conductance, whereby a certain constant voltage occurs at the gate terminal of the transistor m3, i.e., the drain terminal of the transistor m3, due to the Vreset generator activation current. The gate terminal voltage of the transistor m2 is the Vreset generator activation signal ENABLE, the drain terminal voltage of the transistor m2 is the drain terminal voltage of the transistor m3, and a certain constant voltage occurs at the source terminal of the transistor m2 that satisfies the relationship between the Vreset generator activation current, the gate terminal-source terminal voltage (ENABLE—the source terminal voltage of m2), and the drain terminal-source terminal voltage (the drain terminal voltage of the transistor m3—the source terminal voltage of the transistor m2). Similarly, the gate terminal voltage of the transistor m1 is the drain terminal voltage of the transistor m3, the drain terminal voltage of the transistor m1 is the source terminal voltage of the transistor m2, and a certain constant voltage occurs at the source terminal of the transistor m1 that satisfies the relationship between the Vreset generator activation current, the gate terminal-source terminal voltage (the drain terminal voltage of the transistor m3—the source terminal voltage of the transistor m1), and the drain terminal-source terminal voltage (the source terminal voltage of the transistor m2—the source terminal voltage of the transistor m1). Thus, the source terminal voltage of the transistor m1 is generated as the reset voltage Vreset.

This is the series of operations of the Vreset generator 600 of Embodiment 4.

If the reset voltage Vreset generated by the Vreset generator 600 of Embodiment 4 is given to the reset terminal Vreset of the comparator 100 so that the nodes Va and Vb are reset to the reset voltage Vreset generated by the Vreset generator 600 of Embodiment 4 when the comparator 100 is in the Reset state, the potentials at the nodes Va and Vb are controlled in a steady state, and the comparator 100 therefore operates with highest sensitivity, when the clock signal CLK transitions from "low" to "high", i.e., when the comparator 100 transitions from the Reset state to the Compare & Latch state.

As described above, the Vreset generator 600 of Embodiment 4 for the dynamic-type comparator 100 of Embodiment 1, includes a half circuit of the comparator 100 as a replica circuit, and generates the reset voltage Vreset by an operation as described above, whereby the dynamic-type comparator 100 of Embodiment 1 can be operated most efficiently and most quickly.

While the Vreset generator 600 shown in FIG. 6 is formed by only a circuit portion being one element of a differential pair of the comparator 100 shown in FIG. 1, it is understood that it may be formed by the whole of the comparator 100. In such a case, the output terminal Q and the inverted output terminal QB are shorted together, the connecting point between the feedback transistor m1a and the transistor m12 of the input transistor section is connected to the connecting point between the feedback transistor m1b and the transistor m21 of the input transistor section, and the two nodes Va and Vb are connected together.

While NMOS transistors are used for the input transistor section in the Vreset generator 600 of Embodiment 4, similar effects can be obtained also when NMOS transistors are replaced by PMOS transistors in the present configuration, together with the comparator, so that the input transistor section is formed by PMOS transistors.

Embodiment 5

Figure 7:
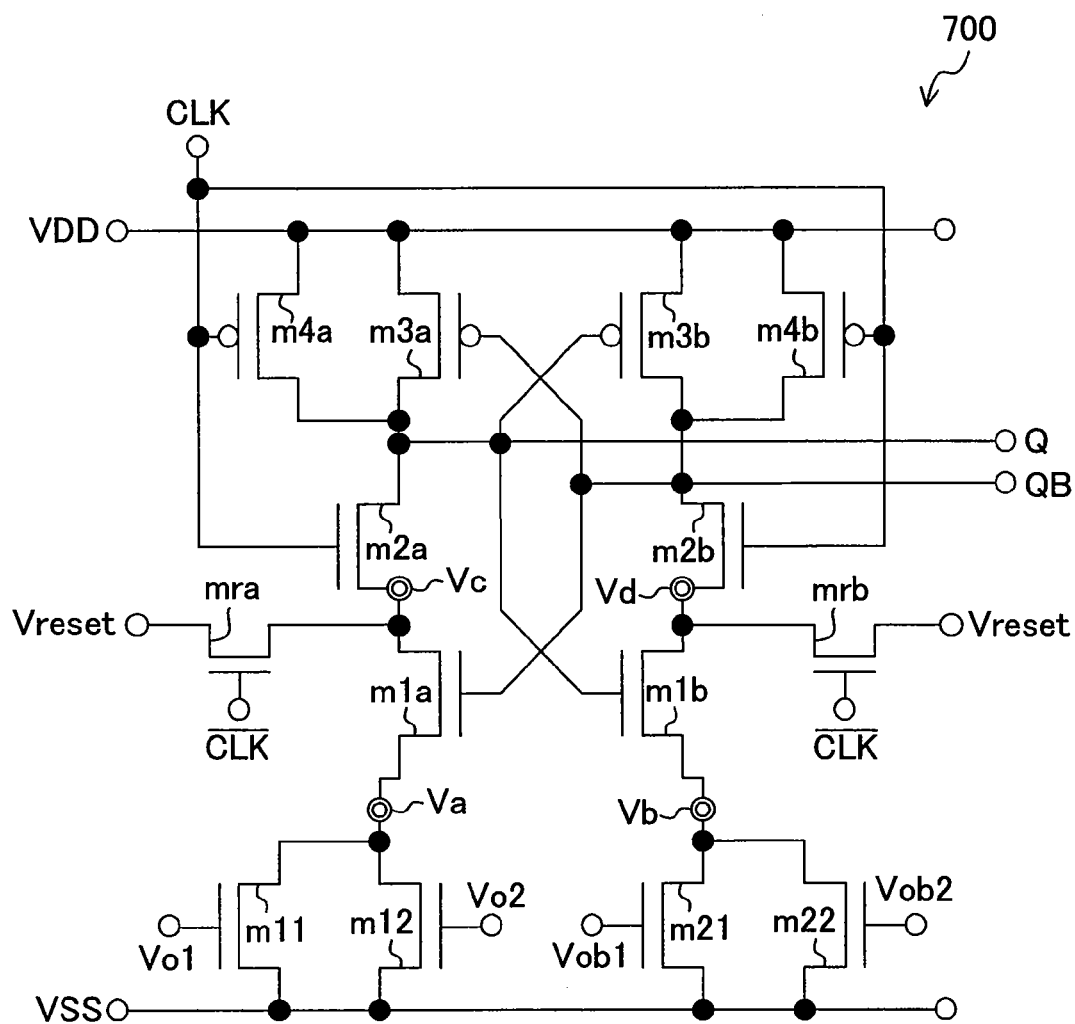
FIG. 7 shows a specific configuration of a comparator of Embodiment 5.

FIG. 7 shows an exemplary configuration of a dynamic-type comparator 700 of Embodiment 5. The comparator 700 includes an input transistor section including NMOS transistors m11, m12, m21 and m22, and a positive feedback section (cross-coupled inverter latch section) including a pair of feedback transistors m1a and m1b being NMOS transistors and a pair of PMOS transistors m3a and m3b, wherein an output terminal QB is connected to the gate terminals of the transistors m1a and m3a and the drain terminal of the transistor m3b of the positive feedback section, and an output terminal Q is connected to the gate terminals of the transistors m1b and m3b and the drain terminal of the transistor m3a of the positive feedback section. A switch transistor m2a being an NMOS transistor turned ON/OFF in synchronism with the clock signal CLK is connected between the drain terminal of the NMOS transistor m1a and the drain terminal of the PMOS transistor m3a, and a switch transistor m2b being an NMOS transistor turned ON/OFF in synchronism with the clock signal CLK is connected between the drain terminal of the NMOS transistor m1b and the drain terminal of the PMOS transistor m3b. The source terminals of the PMOS transistors m3a and m3b are connected to the power supply VDD. A PMOS transistor m4a functioning as a switch in synchronism with the clock signal CLK is connected between the drain terminal of the PMOS transistor m3a and the power supply VDD, and a PMOS transistor m4b functioning as a switch in synchronism with CLK is connected between the drain terminal of the PMOS transistor m3b and the power supply VDD. The positive terminal output Vo1 and the negative terminal output Vob1 of the first differential amplifier and the positive terminal output Vo2 and the negative terminal output Vob2 of the second differential amplifier are connected to the gate terminals of the NMOS transistors m11, m21, m12 and m22, respectively, of the input transistor section, and the reference ground voltage VSS is connected to the source terminal thereof. The drain terminal of the transistors m11 and m12 is connected to the source terminal of the transistor m1a (the node Va), and the drain terminal of the transistors m21 and m22 is connected to the source terminal of the transistor m1b (the node Vb). The gate terminals of the NMOS transistors m2*a* and m2*b* functioning as switches in synchronism with the clock signal CLK and the gate terminals of the PMOS transistors m4*a* and m4*b* functioning as switches in synchronism with the clock signal CLK are connected to the clock signal CLK.

Where the connecting portion between the source terminal of the switch transistor m2*a* and the drain terminal of the feedback transistor m1*a* is denoted as a node Vc and the connecting portion between the source terminal of the switch transistor m2*b* and the drain terminal of the feedback transistor m1*b* is denoted as a node Vd, an NMOS transistor mra functioning as a reset transistor is connected between the node Vc and the reset voltage input terminal Vreset, and an NMOS transistor mrb functioning as a reset transistor is connected between the node Vd and the reset voltage input terminal Vreset, with the inverted signal /CLK of the clock signal being connected to the gate terminals of the NMOS transistors mra and mrb functioning as reset transistors. This is the exemplary configuration of the dynamic-type comparator 700 of Embodiment 5.

Next, referring to FIG. 7, a series of operations of the dynamic-type comparator 700 of Embodiment 5 will be described.

Basically, the series of operations of the dynamic-type comparator 700 of Embodiment 5 is substantially equal to the series of operations of the dynamic-type comparator 100 of Embodiment 1. A difference is the operation in the Reset state where the clock signal CLK is "low" to be described below.

When the clock signal CLK is "low", the NMOS transistors m2*a* and m2*b* are turned OFF and the PMOS transistors m4*a* and m4*b* are turned ON. Then, the positive feedback section is no longer operative, and the output terminals Q and QB are pulled up to "high". At this point, since the transistors m2*a* and m2*b* and OFF, no current flows through this circuit. On the other hand, the inverted signal /CLK of the clock signal goes "high", and the NMOS transistors mra and mrb are turned ON, thus electrically connecting the nodes Vc and Vd with the reset voltage input terminal Vreset. This function is effective even if both of Vo1 and Vo2 or both of Vob1 and Vob2 are below the threshold voltage Vth of the input transistor section, and both of the NMOS transistors m11 and m12 of the input transistor section or both of the transistors m21 and m22 are turned OFF. Therefore, the voltages at the nodes Va and Vb are reset to Vreset. Since the output terminals Q and QB are pulled up to "high", the transistor m1*a* and the transistor m1*b* are turned ON, thus electrically connecting the nodes Vc and Va with each other, and Vd and Vb with each other. Thus, the voltages at the nodes Va and Vb are also reset to Vreset (the Reset state).

When the clock signal CLK is "high", the NMOS transistors m2*a* and m2*b* are turned ON and the PMOS transistors m4*a* and m4*b* are turned OFF. Thus, the positive feedback section becomes operative. The NMOS transistors m11, m12, m21 and m22 of the input transistor section perform a predetermined weighting operation to thereby determine the threshold voltage Vtn, and outputs, to the positive feedback section, the results of a comparison between the difference voltage between the positive terminal output voltage Vo1 and the negative terminal output voltage Vob1 of the first differential amplifier and the difference voltage between the second differential amplifier and the positive terminal output voltage Vo2. The realization of the predetermined weighting operation has already been described, and will not be further described below. The drain currents of the transistors m11, m12, m21 and m22 of the input transistor section vary depending on the gate terminal voltages thereof. Therefore, a drain voltage VDS1 occurs according to the gate terminal voltage of the transistors m11 and m12, and a drain voltage VDS2 occurs according to the gate terminal voltage of the transistors m21 and m22. The positive feedback section positively feeds back the difference voltage between VDS1 and VDS2, and the positive feedback section amplifies it to the power supply voltage VDD, i.e., "high", or the reference ground voltage VSS, i.e., "low", and stores the amplified state (the Compare & Latch state). While a current flows through this circuit during a period in which the output terminals Q and QB of the comparator are transitioning, no current flows through this circuit when the transition of the output terminals Q and QB is completed to enter Latch State. For example, where VDS1>VDS2, the output terminal Q of the comparator is amplified to "high" and the output terminal QB is amplified to "low" by positively feeding back the difference voltage. On the other hand, the inverted signal /CLK of the clock signal goes "low" and the NMOS transistors mra and mrb are turned OFF, thus disconnecting the nodes Vc and Vd from the reset voltage input terminal Vreset.

Other than this, the principle of the circuit operation is equal to that of the dynamic-type comparator 100 of Embodiment 1.

This is the description of the series of operations of the dynamic-type comparator 700 of Embodiment 5.

As described above, the dynamic-type comparator 700 of Embodiment 5 has a function of resetting the nodes Vc and Vd, and also the nodes Va and Vb, to Vreset by using switches operating in synchronism with the inverted signal of the clock signal in the Reset state, whereby it is possible to reduce the deterioration of the comparison precision occurring when the clock signal frequency and the analog input signal frequency are high, which is a problem with conventional techniques.

Embodiment 6

Figure 8:
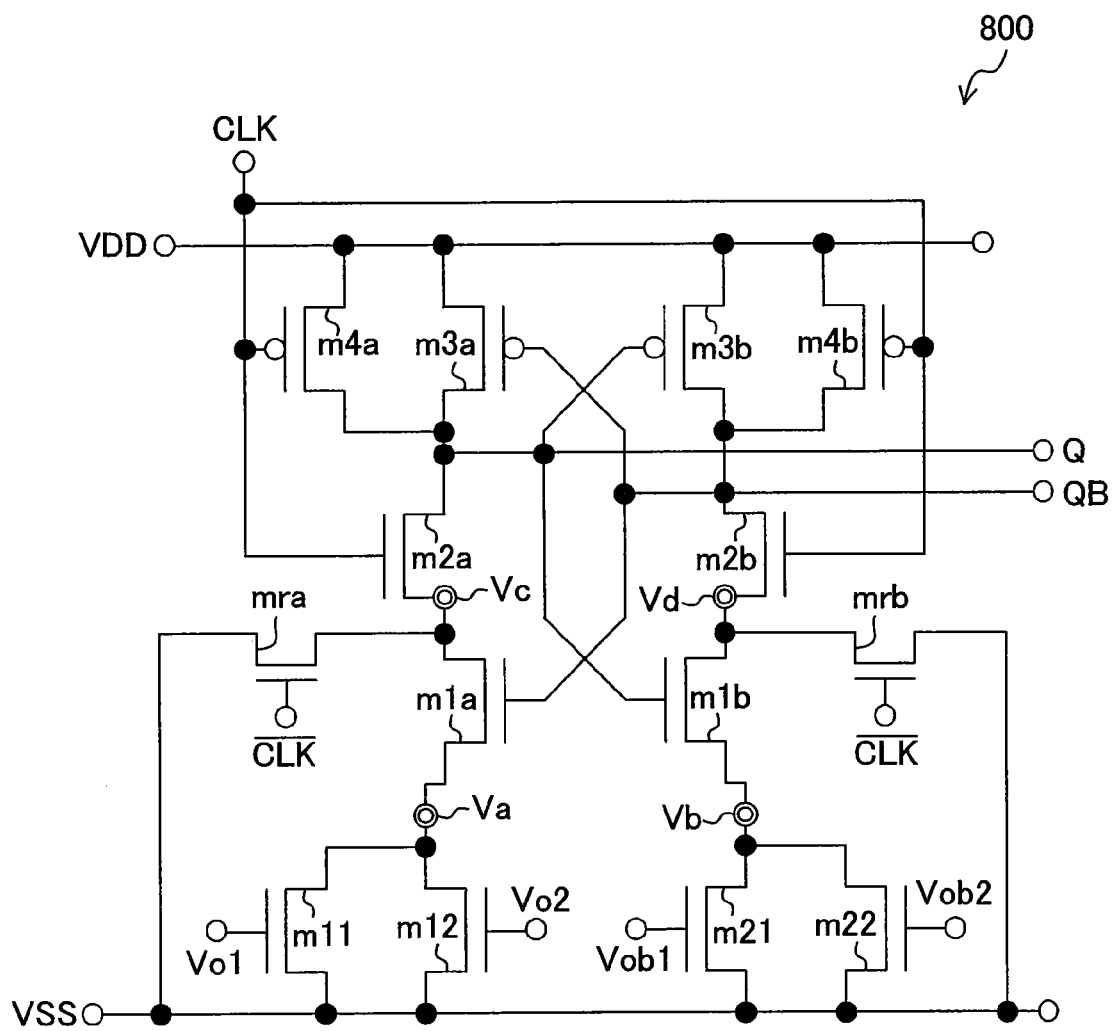
FIG. 8 shows a specific configuration of a comparator of Embodiment 6.

FIG. 8 shows an exemplary configuration of a dynamic-type comparator 800 of Embodiment 6. The comparator 800 includes an input transistor section including NMOS transistors m11, m12, m21 and m22, and a positive feedback section (cross-coupled inverter latch section) including NMOS transistors m1*a* and m1*b* and PMOS transistors m3*a* and m3*b*, wherein an output terminal QB is connected to the gate terminals of the transistors m1*a* and m3*a* and the drain terminal of the transistor m3*b* of the positive feedback section, and an output terminal Q is connected to the gate terminals of the transistors m1*b* and m3*b* and the drain terminal of the transistor m3*a* of the positive feedback section. An NMOS transistor m2*a* functioning as a switch in synchronism with the clock signal CLK is connected between the drain terminal of the NMOS transistor m1*a* and the drain terminal of the PMOS transistor m3*a*, and an NMOS transistor m2*b* functioning as a switch in synchronism with CLK is connected between the drain terminal of the NMOS transistor m1*b* and the drain terminal of the PMOS transistor m3*b*. The source terminals of the PMOS transistors m3*a* and m3*b* are connected to the power supply VDD. A PMOS transistor m4*a* functioning as a switch in synchronism with the clock signal CLK is connected between the drain terminal of the PMOS transistor m3*a* and the power supply VDD, and a PMOS transistor m4*b* functioning as a switch in synchronism with CLK is connected between the drain terminal of the PMOS transistor m3*b* and the power supply VDD. The positive terminal output Vo1 and the negative terminal output Vob1 of the first differential amplifier and the positive terminal output Vo2 and the negative terminal output Vob2 of the second differential amplifier are connected to the gate terminals of the NMOS transistors m11, m21, m12 and m22, respectively, of the input transistor section, and the reference ground voltage VSS is connected to the source terminal. The drain terminals of the transistors m11 and m12 are connected to the source terminal of the transistor m1a (the node Va), and the drain terminals of the transistors m21 and m22 are connected to the source terminal of the transistor m1b (Vb). The gate terminals of the NMOS transistors m2a and m2b functioning as switches in synchronism with the clock signal CLK and the gate terminals of the PMOS transistors m4a and m4b functioning as switches in synchronism with the clock signal CLK are connected to the clock signal CLK. Moreover, where the connecting point between the source terminal of the transistor m2a and the drain terminal of the transistor m1a is denoted as a node Vc, and the connecting point between the source terminal of the transistor m2b and the drain terminal of the transistor m1b is denoted as a node Vd, an NMOS transistor mra functioning as a reset transistor is connected between the node Vc and the ground voltage VSS, and an NMOS transistor mrb functioning as a reset transistor is connected between Vd and the ground voltage VSS, with the inverted signal /CLK of the clock signal being connected to the gate terminals of the NMOS transistors mra and mrb functioning as reset transistors. This is the exemplary configuration of the dynamic-type comparator 800 of Embodiment 6.

Next, referring to FIG. 8, a series of operations of the dynamic-type comparator 800 of Embodiment 6 will be described.

Basically, the series of operations of the dynamic-type comparator 800 of Embodiment 6 is substantially equal to the series of operations of the dynamic-type comparator 100 of Embodiment 1. A difference is the operation in the Reset state where the clock signal CLK is "low" to be described below.

When the clock signal CLK is "low", the NMOS transistors m2a and m2b are turned OFF and the PMOS transistors m4a and m4b are turned ON. Then, the positive feedback section is no longer operative, and the output terminals Q and QB are pulled up to "high". At this point, since the transistors m2a and m2b are OFF, no current flows through this circuit. On the other hand, the inverted signal /CLK of the clock signal goes "high", and the NMOS transistors mra and mrb are turned ON, thus electrically connecting the nodes Vc and Vd with the ground voltage VSS. Since the output terminals Q and QB are pulled up to "high", the transistors m1a and m1b are turned ON, thus electrically connecting the nodes Vc and Va with each other, and Vd and Vb with each other. Thus, the voltages at the nodes Va and Vb are also reset to the ground voltage VSS. This function is effective even if both of Vo1 and Vo2 or both of Vob1 and Vob2 are below the threshold voltage Vth of the input transistor section, and both of the NMOS transistors m11 and m12 of the input transistor section or both of the transistors m21 and m22 are turned OFF. Therefore, the voltages at the nodes Va and Vb are reset to the ground voltage VSS. Since the output terminals Q and QB are pulled up to "high", the transistors m1a and m1b are turned ON, thus electrically connecting the nodes Vc and Va with each other, and the nodes Vd and Vb with each other. Thus, the voltages at the nodes Va and Vb are also reset to the ground voltage VSS (the Reset state).

When the clock signal CLK is "high", the NMOS transistors m2a and m2b are turned ON and the PMOS transistors m4a and m4b are turned OFF. Thus, the positive feedback section becomes operative. The NMOS transistors m11, m12, m21 and m22 of the input transistor section perform a predetermined weighting operation to thereby determine the threshold voltage Vtn, and outputs, to the positive feedback section, the results of a comparison between the difference voltage between the positive terminal output voltage Vo1 and the negative terminal output voltage Vob1 of the first differential amplifier and the difference voltage between the second differential amplifier and the positive terminal output voltage Vo2. The realization of the predetermined weighting operation has already been described, and will not be further described below. The drain currents of the transistors m11, m12, m21 and m22 of the input transistor section vary depending on the gate terminal voltages thereof. Therefore, a drain voltage VDS1 occurs according to the gate terminal voltage of the transistor m11 and the transistor m12, and a drain voltage VDS2 occurs according to the gate terminal voltage of the transistors m21 and m22. The positive feedback section positively feeds back the difference voltage between VDS1 and VDS2, and the positive feedback section amplifies it to the power supply voltage VDD, i.e., "high", or the reference ground voltage VSS, i.e., "low", and stores the amplified state (the Compare & Latch state). While a current flows through this circuit during a period in which the output terminals Q and QB of the comparator are transitioning, no current flows through this circuit when the transition of the output terminals Q and QB is completed to enter Latch State. For example, where VDS1>VDS2, the output terminal Q of the comparator is amplified to "high" and the output terminal QB is amplified to "low" by positively feeding back the difference voltage. On the other hand, the inverted signal /CLK of the clock signal goes "low" and the NMOS transistors mra and mrb are turned OFF, thus disconnecting the nodes Ve and Vd from the reference ground voltage VSS.

Other than this, the principle of the circuit operation is equal to that of the dynamic-type comparator 100 of Embodiment 1.

This is the description of the series of operations of the dynamic-type comparator 800 of Embodiment 6.

As described above, the dynamic-type comparator 800 of Embodiment 6 has a function of resetting the nodes Vc and Vd, and also the nodes Va and Vb, to the ground voltage VSS by using switches operating in synchronism with the inverted signal of the clock signal in the Reset state, whereby it is possible to reduce the deterioration of the comparison precision occurring when the clock signal frequency and the analog input signal frequency are high, which is a problem with conventional techniques. The comparator differs from the comparator 700 in that the reset voltage input terminal Vreset is not needed and the voltages at the nodes Ve and Vd in the Reset state are not Vreset but the ground voltage VSS.

Embodiment 7

Figure 9:
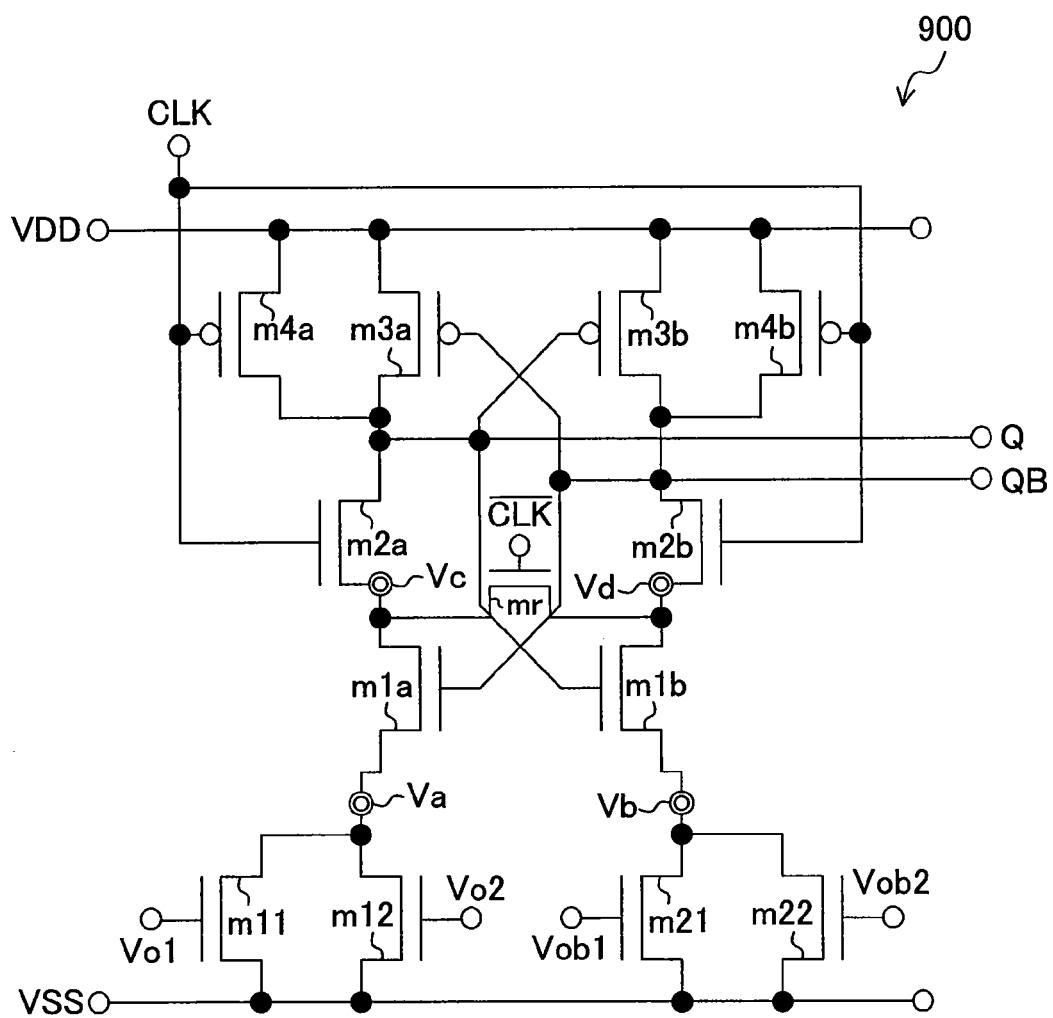
FIG. 9 shows a specific configuration of a comparator of Embodiment 7.

FIG. 9 shows an exemplary configuration of a dynamic-type comparator 900 of Embodiment 7. The comparator 900 includes an input transistor section including NMOS transistors m11, m12, m21 and m22, and a positive feedback section (cross-coupled inverter latch section) including NMOS transistors m1a and m1b and PMOS transistors m3a and m3b, wherein an output terminal QB is connected to the gate terminals of the transistors m1a and m3a and the drain terminal of the transistor m3b of the positive feedback section, and an output terminal Q is connected to, the gate terminals of the transistors m1b and m3b and the drain terminal of the transistor m3a of the positive feedback section. An NMOS transistor m2a functioning as a switch in synchronism with the clock signal CLK is connected between the drain terminal of the NMOS transistor m1a and the drain terminal of the PMOS transistor m3a, and an NMOS transistor m2b functioning as a switch in synchronism with CLK is connected between the drain terminal of the NMOS transistor m1b and the drain terminal of the PMOS transistor m3b. The source terminals of the PMOS transistors m3a and m3b are connected to the power supply VDD. A PMOS transistor m4a functioning as a switch in synchronism with the clock signal CLK is connected between the drain terminal of the PMOS transistor m3a and the power supply VDD, and a PMOS transistor m4b functioning as a switch in synchronism with CLK is connected between the drain terminal of the PMOS transistor m3b and the power supply VDD. The positive terminal output Vo1 and the negative terminal output Vob1 of the first differential amplifier and the positive terminal output Vo2 and the negative terminal output Vob2 of the second differential amplifier are connected to the gate terminals of the NMOS transistors m11, m21, m12 and m22, respectively, of the input transistor section, and the reference ground voltage VSS is connected to the source terminal thereof. The drain terminals of the transistors m11 and m12 are connected to the source terminal of the transistor m1a (the node Va), and the drain terminals of the transistors m21 and m22 are connected to the source terminal of the transistor m1b (Vb). The gate terminals of the NMOS transistors m2a and m2b functioning as switches in synchronism with the clock signal CLK and the gate terminals of the PMOS transistors m4a and m4b functioning as switches in synchronism with the clock signal CLK are connected to the clock signal CLK. Moreover, where the connecting point between the source terminal of the transistor m2a and the drain terminal of the transistor m1a is denoted as a node Vc, and the connecting point between the source terminal of the transistor m2b and the drain terminal of the transistor m1b is denoted as Vd, the NMOS transistor mr functioning as a reset transistor is connected between the nodes Ve and Vd, and the inverted signal /CLK of the clock signal is connected to the gate terminal of the NMOS transistor mr functioning as a reset transistor. This is the exemplary configuration of the dynamic-type comparator 900 of Embodiment 7.

Next, referring to FIG. 9, a series of operations of the dynamic-type comparator 900 of Embodiment 7 will be described.

Basically, the series of operations of the dynamic-type comparator 900 of Embodiment 7 is substantially equal to the series of operations of the dynamic-type comparator 100 of Embodiment 1. A difference is the operation in the Reset state where the clock signal CLK is "low" to be described below.

When the clock signal CLK is "low", the NMOS transistors m2a and m2b are turned OFF and the PMOS transistors m4a and m4b are turned ON. Then, the positive feedback section is no longer operative, and the output terminals Q and QB are pulled up to "high". At this point, since the transistors m2a and m2b are OFF, no current flows through this circuit. On the other hand, the inverted signal /CLK of the clock signal goes "high", and the NMOS transistor mr is turned ON, thus electrically connecting together the nodes Vc and Vd. Since the output terminals Q and QB are pulled up to "high", the transistors m1a and m1b are turned ON, thus electrically connecting the nodes Vc and Va with each other, and Vd and Vb with each other. Thus, the nodes Va and Vb are electrically connected together, and the nodes Vc and Vd are electrically connected together. This function is effective even if both of Vo1 and Vo2 or both of Vob1 and Vob2 are below the threshold voltage Vth of the input transistor section, and both of the NMOS transistors m11 and m12 of the input transistor section or both of the transistors m21 and m22 are turned OFF. Therefore, the voltages at the nodes Vc and Vd are reset to the same potential. Since the output terminals Q and QB are pulled up to "high", the transistors m1a and m1b are turned ON, thus electrically connecting the nodes Vc and Va with each other, and Vd and Vb with each other. After all, the nodes Va, Vb, Vc and Vd are reset to the ground voltage VSS (the Reset state), assuming that no current is flowing through this circuit and one or more of the transistors m11, m12, m21 and m22 are ON.

When the clock signal CLK is "high", the NMOS transistors m2a and m2b are turned ON and the PMOS transistors m4a and m4b are turned OFF. Thus, the positive feedback section becomes operative. The NMOS transistors m11, m12, m21 and m22 of the input transistor section perform a predetermined weighting operation to thereby determine the threshold voltage Vtn, and outputs, to the positive feedback section, the results of a comparison between the difference voltage between the positive terminal output voltage Vo1 and the negative terminal output voltage Vob1 of the first differential amplifier and the difference voltage between the second differential amplifier and the positive terminal output voltage Vo2. The realization of the predetermined weighting operation has already been described, and will not be further described below. The drain currents of the transistors m11, m12, m21 and m22 of the input transistor section vary depending on the gate terminal voltages thereof. Therefore, a drain voltage VDS1 occurs according to the gate terminal voltage of the transistors m11 and m12, and a drain voltage VDS2 occurs according to the gate terminal voltage of the transistors m21 and m22. The positive feedback section positively feeds back the difference voltage between VDS1 and VDS2, and the positive feedback section amplifies it to the power supply voltage VDD, i.e., "high", or the reference ground voltage VSS, i.e., "low", and stores the amplified state (the Compare & Latch state). While a current flows through this circuit during a period in which the output terminals Q and QB of the comparator are transitioning, no current flows through this circuit when the transition of the output terminals Q and QB is completed to enter Latch State. For example, where VDS1>VDS2, the output terminal Q of the comparator is amplified to "high" and the output terminal QB is amplified to "low" by positively feeding back the difference voltage. On the other hand, the inverted signal /CLK of the clock signal goes "low" and the NMOS transistor mr is turned OFF, thus disconnecting the nodes Vc and Vd.

Other than this, the principle of the circuit operation is equal to that of the dynamic-type comparator 100 of Embodiment 1.

This is the description of the series of operations of the dynamic-type comparator 900 of Embodiment 7.

As described above, the dynamic-type comparator 900 of Embodiment 7 has a function of resetting the nodes Va, Vb, Vc and Vd to the same potential by using switches operating in synchronism with the inverted signal of the clock signal in the Reset state, whereby it is possible to reduce the deterioration of the comparison precision occurring when the clock signal frequency and the analog input signal frequency are high, which is a problem with conventional techniques. The comparator differs from the comparator 100 in that the reset voltage input terminal Vreset is not needed, the voltages at the nodes Vc and Vd in the Reset state are not Vreset but the nodes Vc and Vd are at the same potential, or the voltages at the nodes Va, Vb, Vc and Vd are the ground voltage VSS if any of the transistors m11, m12, m21 and m22 is ON in the Reset state. The comparator differs from the comparator 800 in that the configuration can be realized with one less reset transistors.

Embodiment 8

Figure 10:
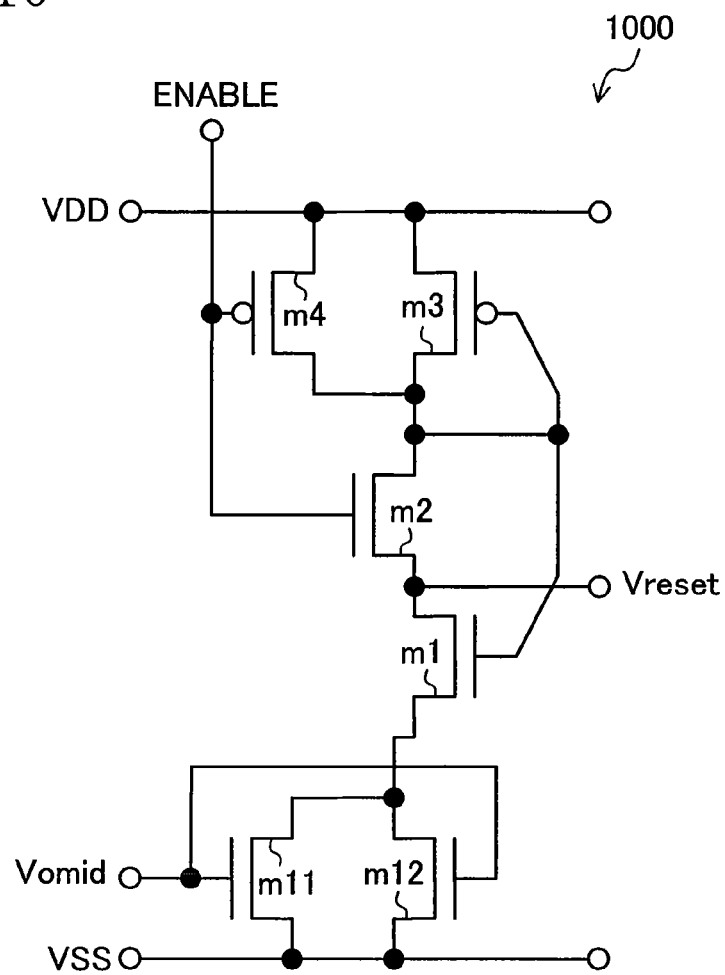
FIG. 10 shows a specific configuration of a Vreset generator in a comparator of Embodiment 8.

FIG. 10 shows an exemplary configuration of a Vreset generator (reset voltage generator) 1000 of Embodiment 8 for the dynamic-type comparator 700 of Embodiment 5. The Vreset generator 1000 is a half circuit of the comparator 700, and is configured as a replica circuit of the comparator 700. It includes an input transistor section including NMOS transistors m11 and m12, and an NMOS transistor m1 and a PMOS transistor m3 being a half circuit of the positive feedback section of the comparator 700, wherein the gate terminals of the transistors m1 and m3 and the drain terminal of the transistor m3 are connected to each other. An NMOS transistor m2 functioning as a switch in synchronism with the Vreset generator activation signal ENABLE is connected between the drain terminal of the NMOS transistor m1 and the drain terminal of the PMOS transistor m3. The source terminals of the PMOS transistors m3 and VDD are connected to the power supply VDD. A PMOS transistor m4 functioning as a switch in synchronism with the Vreset generator activation signal ENABLE is connected between the drain terminal of the PMOS transistor m3 and the power supply VDD. The common mode voltage Vomid between the positive terminal output and the negative terminal output of the differential amplifier is connected to the gate terminals of the NMOS transistors m11 and m12 of the input transistor section, the reference ground voltage VSS is connected to the source terminal thereof, the drain terminals of the NMOS transistors m11 and m12 are connected to the source terminal of the feedback transistor m1, the drain terminal of the feedback transistor m1 is connected to the source terminal of the switch transistor m2, and the voltage at the connecting portion between the feedback transistor m1 and the switch transistor m2 is externally output as the predetermined reset voltage Vreset. The gate terminal of the NMOS transistor m2 functioning as a switch in synchronism with the Vreset generator activation signal ENABLE and the gate terminal of the PMOS transistor m4 functioning as a switch in synchronism with the Vreset generator activation signal ENABLE are connected to the Vreset generator activation signal ENABLE. This is the exemplary configuration of the Vreset generator 1000 of Embodiment 8 for the dynamic-type comparator 700 of Embodiment 5.

Next, referring to FIG. 10, a series of operations of the Vreset generator 1000 of Embodiment 4 will be described.

When the Vreset generator activation signal ENABLE is "low", the NMOS transistor m2 is turned OFF and the PMOS transistor m4 is turned ON. Then, the half circuit of the positive feedback section of the comparator 700 is no longer operative, whereby the gate terminal voltage of the transistor m3 is pulled up to "high", and the reset voltage Vreset converges to "low". At this point, since the transistor m2 is OFF, no current flows through this circuit.

When the Vreset generator activation signal ENABLE is "high", the NMOS transistor m2 is turned ON and the PMOS transistor m4 is turned OFF. Thus, the half circuit of the positive feedback section of the comparator 100 becomes operative. It is assumed that the NMOS transistors m11 and m12 of the input transistor section have a predetermined size ratio. For example, the size ratio of the gate width W between the transistor m11 and the transistor m12 is set to (m/2)/m: (m/2)/m as in Expression (1.6). As described above in the description of the operation of Embodiment 1 of the present invention, any method may be used for realizing the predetermined size ratio. In this case, the gate terminal-source terminal voltage of the transistors m11 and m12 is Vomid, and a certain constant drain current flows from the transistors m11 and m12 to this circuit according to Vomid. The combined current of the drain currents of the transistors m11 and m12 flows through the transistors m3 and m2 and m1. This is used as the Vreset generator activation current. The transistor m3, being in a diode connection where the gate terminal and the drain terminal thereof are connected to each other, operates as a resistor having a certain constant conductance, whereby a certain constant voltage occurs at the gate terminal of the transistor m3, i.e., the drain terminal of the transistor m3, due to the Vreset generator activation current. The gate terminal voltage of the transistor m2 is the Vreset generator activation signal ENABLE, the drain terminal voltage of the transistor m2 is the drain terminal voltage of the transistor m3, and a certain constant voltage occurs at the source terminal of the transistor m2 that satisfies the relationship between the Vreset generator activation current, the gate terminal-source terminal voltage (ENABLE—the source terminal voltage of the transistor m2), and the drain terminal-source terminal voltage (the drain terminal voltage of the transistor m3—the source terminal voltage of the transistor m2). Similarly, the gate terminal voltage of the transistor m1 is the drain terminal voltage of the transistor m3, the drain terminal voltage of the transistor m1 is the source terminal voltage of the transistor m2, and a certain constant voltage occurs at the source terminal of the transistor m1 that satisfies the relationship between the Vreset generator activation current, the gate terminal-source terminal voltage (the drain terminal voltage of the transistor m3—the source terminal voltage of the transistor m1), and the drain terminal-source terminal voltage (the source terminal voltage of the transistor m2—the source terminal voltage of the transistor m1). Thus, the source terminal voltage of the transistor m2 is generated as the reset voltage Vreset.

This is the series of operations of the Vreset generator 1000 of Embodiment 8.

If the reset voltage Vreset generated by the Vreset generator 1000 of Embodiment 8 is given to the reset terminal Vreset of the comparator 700 so that the nodes Vc and Vd are reset to the reset voltage Vreset generated by the Vreset generator 100 of Embodiment 8 when the comparator 700 is in the Reset state, the comparator 700 operates with highest sensitivity, when the clock signal CLK transitions from "low" to "high", i.e., when the comparator 700 transitions from the Reset state to the Compare & Latch state.

As described above, the Vreset generator 1000 of Embodiment 8 for the dynamic-type comparator 700 of Embodiment 5, includes a half circuit of the comparator 700 as a replica circuit, and generates the reset voltage Vreset by an operation as described above, whereby the dynamic-type comparator 700 of Embodiment 5 can be operated most efficiently and most quickly.

While the Vreset generator 1000 shown in FIG. 10 is formed by only a circuit portion being one element of a differential pair of the comparator 700 shown in FIG. 7, it is understood that it may be formed by the whole of the comparator 700.

While NMOS transistors are used for the input transistor section in the Vreset generator 1000 of Embodiment 8, similar effects can be obtained also when NMOS transistors are replaced by PMOS transistors in the present configuration, together with the comparator, so that the input transistor section is formed by PMOS transistors.

Embodiment 9

Figure 11:
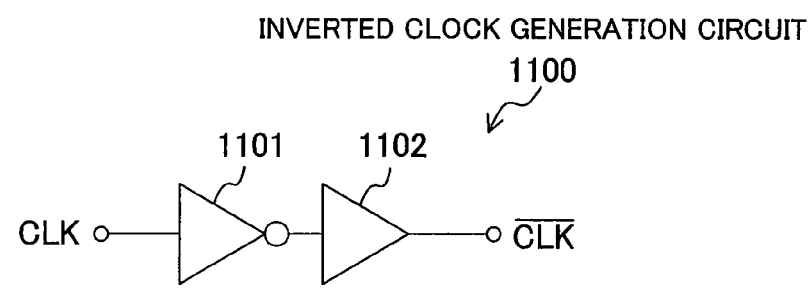
FIG. 11 shows a specific configuration of an inverted clock generation circuit in a comparator of Embodiment 9.

FIG. 11 shows an exemplary configuration of an inverted clock generation circuit (delay circuit) 1100 for generating, from the clock signal CLK, the inverted signal /CLK of the clock signal, which is given to the gate terminal of the reset transistor used in the comparator 100 of Embodiment 1, the comparator 400 of Embodiment 2, the comparator 500 of Embodiment 3, the comparator 700 of Embodiment 5, the comparator 800 of Embodiment 6, or the comparator 900 of Embodiment 7. The inverted clock generation circuit 1100 includes an inverter 1101 and a buffer 1102. The clock signal CLK is given to the input terminal of the inverter 1101, the output of the inverter 1101 and the input of the buffer 1102 are connected together, and the output of the buffer 1102 is output as the inverted signal /CLK of the clock signal. This is the exemplary configuration of the inverted clock generation circuit 1100 of Embodiment 9. Next, referring to FIG. 11, a series of operations of the inverted clock generation circuit 1100 of Embodiment 11 will be described.

When the clock signal CLK is given to the inverter 1101, the inverter 1101 outputs the inverted signal of the clock signal CLK with a predetermine delay. When the inverted signal of the clock signal CLK output by the inverter 1101 is given to the buffer 1102, the buffer 1102 outputs the inverted signal /CLK of the clock signal CLK further with a predetermine delay from the received inverted signal of the clock signal CLK.

This is the series of operations of the inverted clock generation circuit 1100 of Embodiment 11.

If the inverted signal /CLK of the clock signal CLK output by the inverted clock generation circuit 1100 is given to the gate terminal of the reset transistor used in the comparator 100 of Embodiment 1, the comparator 400 of Embodiment 2, the comparator 500 of Embodiment 3, the comparator 700 of Embodiment 5, the comparator 800 of Embodiment 6, or the comparator 900 of Embodiment 7, it is possible to operate the comparator with an even higher precision.

Next, referring to FIG. 12, the operation where the inverted signal /CLK of the clock signal CLK output by the inverted clock generation circuit 1100 is given to the gate terminal of the reset transistor used in the comparator 100 of Embodiment 1 will be described in greater detail.

Figure 12:
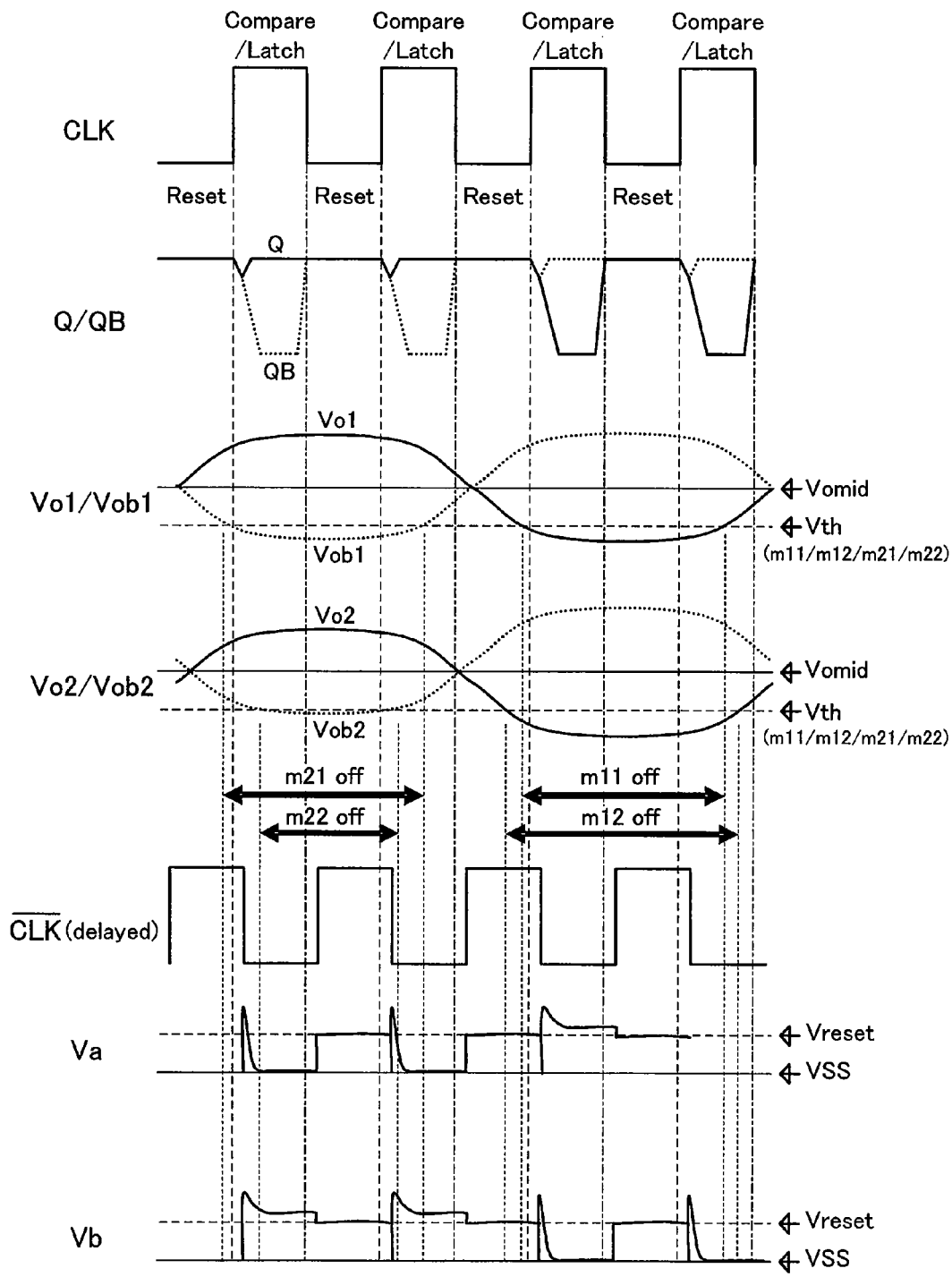
FIG. 12 shows a timing diagram of a comparator using the inverted clock generation circuit.

FIG. 12 shows a timing diagram of the clock signal CLK, the output terminals Q and QB of the comparator 100, the positive terminal output Vo1 and the negative terminal output Vob1 of the first differential amplifier and the positive terminal output Vo2 and the negative terminal output Vob2 of the second differential amplifier, the inverted signal /CLK of the clock signal CLK output by the inverted clock generation circuit 1100, and the voltages at the nodes Va and Vb of the comparator 100.

When the clock signal CLK is "low", the NMOS transistors m2a and m2b are turned OFF and the PMOS transistors m4a and m4b are turned ON. Then, the positive feedback section is no longer operative, and the output terminals Q and QB are pulled up to "high". At this point, since the transistors m2a and m2b and OFF, no current flows through this circuit. On the other hand, the inverted signal /CLK of the clock signal goes "high" with a predetermine delay from the instance the clock signal CLK transitions to "low", and the NMOS transistors mra and mrb are turned ON, thus electrically connecting the nodes Va and Vb with the reset voltage input terminal Vreset. This function is effective even if both of Vo1 and Vo2 or both of Vob1 and Vob2 are below the threshold voltage Vth of the input transistor section, and both of the NMOS transistors m11 and m12 of the input transistor section or both of the transistors m21 and m22 are turned OFF. Therefore, the voltages at the nodes Va and Vb are reset to Vreset (the Reset state).

When the clock signal CLK is "high", the NMOS transistors m2a and m2b are turned ON and the PMOS transistors m4a and m4b are turned OFF. Thus, the positive feedback section becomes operative. However, at the instance the clock signal CLK transitions to "high", the inverted signal /CLK of the clock signal is still "low". Therefore, although the positive feedback section is operative, the comparison has not been started (Stand-by State). The NMOS transistors m11, m12, m21 and m22 of the input transistor section perform a predetermined weighting operation to thereby determine the threshold voltage Vtn, and outputs, to the positive feedback section, the results of a comparison between the difference voltage between the positive terminal output voltage Vo1 and the negative terminal output voltage Vob1 of the first differential amplifier and the difference voltage between the second differential amplifier and the positive terminal output voltage Vo2. The realization of the predetermined weighting operation has already been described, and will not be further described below. After the passage of a predetermined delay since the transition of the clock signal CLK to "high", the inverted signal /CLK of the clock signal goes "low", and the NMOS transistors mra and mrb is turned OFF, thus disconnecting the nodes Va and Vb from the reset voltage input terminal Vreset. The drain currents of the transistors m11, m12, m21 and m22 of the input transistor section vary depending on the gate terminal voltages. Therefore, a drain voltage VDS1 occurs according to the gate terminal voltage of the transistors m11 and m12, and a drain voltage VDS2 occurs according to the gate terminal voltage of the transistors m21 and m22. The positive feedback section positively feeds back the difference voltage between VDS1 and VDS2, and the positive feedback section amplifies it to the power supply voltage VDD, i.e., "high", or the reference ground voltage VSS, i.e., "low", and stores the amplified state (the Compare & Latch state). While a current flows through this circuit during a period in which the output terminals Q and QB of the comparator are transitioning, no current flows through this circuit when the transition of the output terminals Q and QB is completed to enter Latch State. For example, where VDS1>VDS2, the output terminal Q of the comparator is amplified to "high" and the output terminal QB is amplified to "low" by positively feeding back the difference voltage.

Other than this, the principle of the circuit operation is equal to that of the dynamic-type comparator 100 of Embodiment 1.

This is the series of operations when the inverted signal /CLK of the clock signal CLK output by the inverted clock generation circuit 1100 of Embodiment 9 is given to the gate terminal of the reset transistor used in the comparator 100 of Embodiment 1.

As described above, if the inverted signal /CLK of the clock signal to be given to the gate terminal of the reset transistor used in the comparator 100 of Embodiment 1, the comparator 400 of Embodiment 2, the comparator 500 of Embodiment 3, the comparator 700 of Embodiment 5, the comparator 800 of Embodiment 6, or the comparator 900 of Embodiment 7 is given by the inverted clock generation circuit 1100 for generating the clock signal CLK, the configuration has a function of resetting the nodes Va and Vb to Vreset or the ground voltage VSS by using switches operating in synchronism with the inverted signal of the clock signal with a predetermined delay from the clock signal CLK in the Reset state, and the configuration also has Stand-by State where the nodes Va and Vb are in a the Reset state even at the instance the clock signal CLK transitions to "high". Therefore, the positive feedback section transitions from the steady state where the nodes Va and Vb are at the reset voltage to the Compare & Latch state. Thus, it is possible to more stably reduce the deterioration of the comparison precision even if the clock signal frequency and the analog input signal frequency are high.

While the inverted clock generation circuit 1100 of Embodiment 9 includes the buffer 1102, similar effects can be obtained by using only the inverter 1101.

While the output of the inverter 1101 is given as the input to the buffer 1102 in the inverted clock generation circuit 1100 of Embodiment 9, similar effects can be obtained also when the clock signal CLK is given to the buffer 1102 and the output of the buffer 1102 is given to the inverter 1101.

The comparator including the inverted clock generation circuit 1100 of the present embodiment may be any of the comparators of the first to eighth embodiments. Where an A/D converter is formed by using a plurality of comparators, the configuration may employ the inverted clock generation circuit 1100 of the present embodiment in at least one of the plurality of comparators.

Embodiment 10

Figure 13:
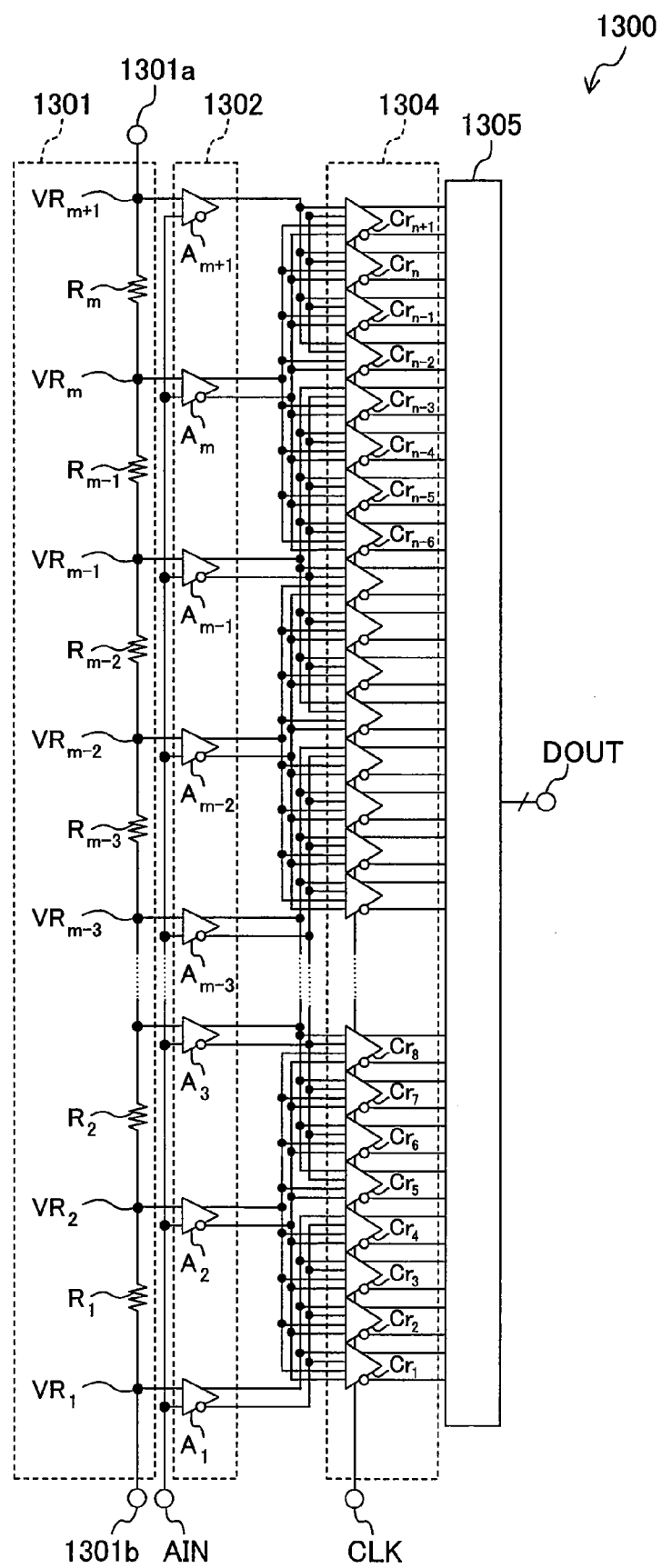
FIG. 13 shows a configuration of an A/D converter of Embodiment 10.
Figure 14:
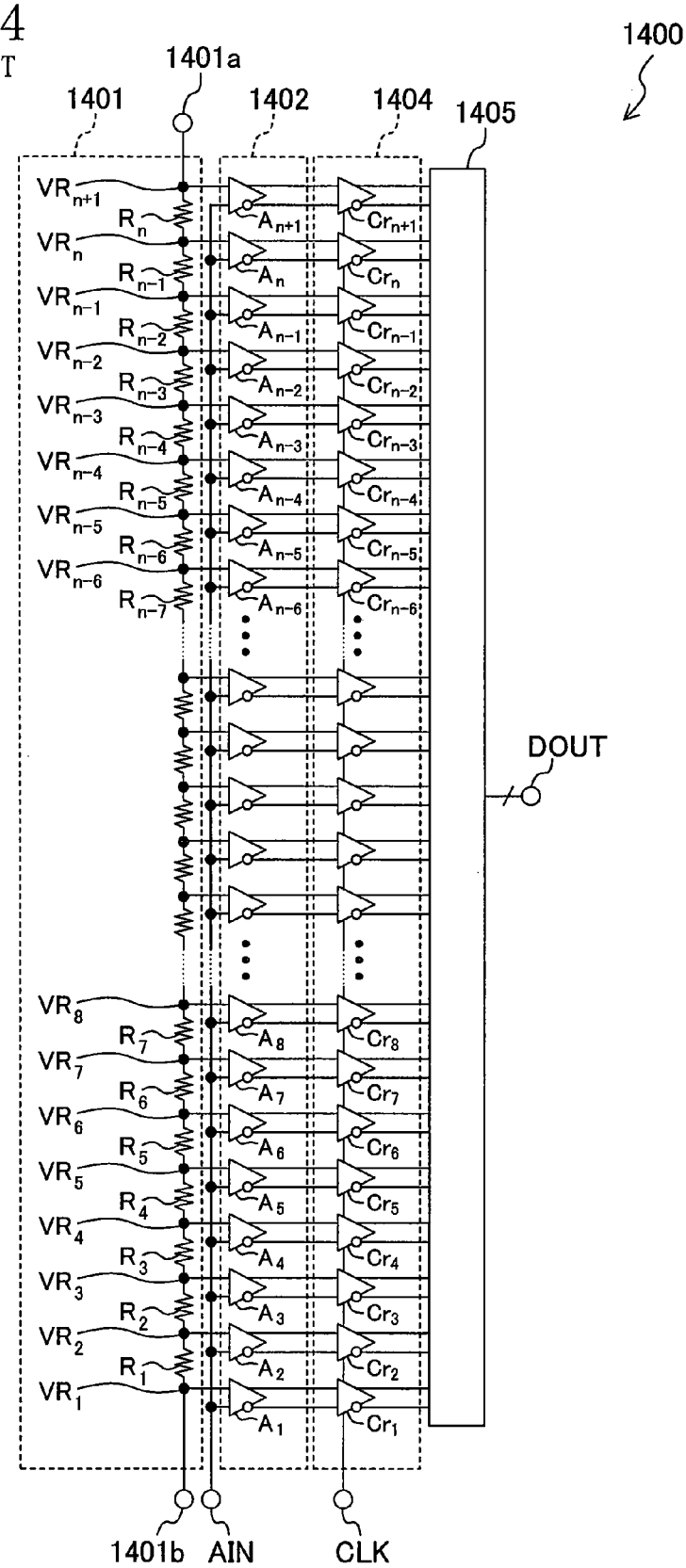
FIG. 14 shows a configuration of a conventional parallel-type A/D converter.
Figure 15:
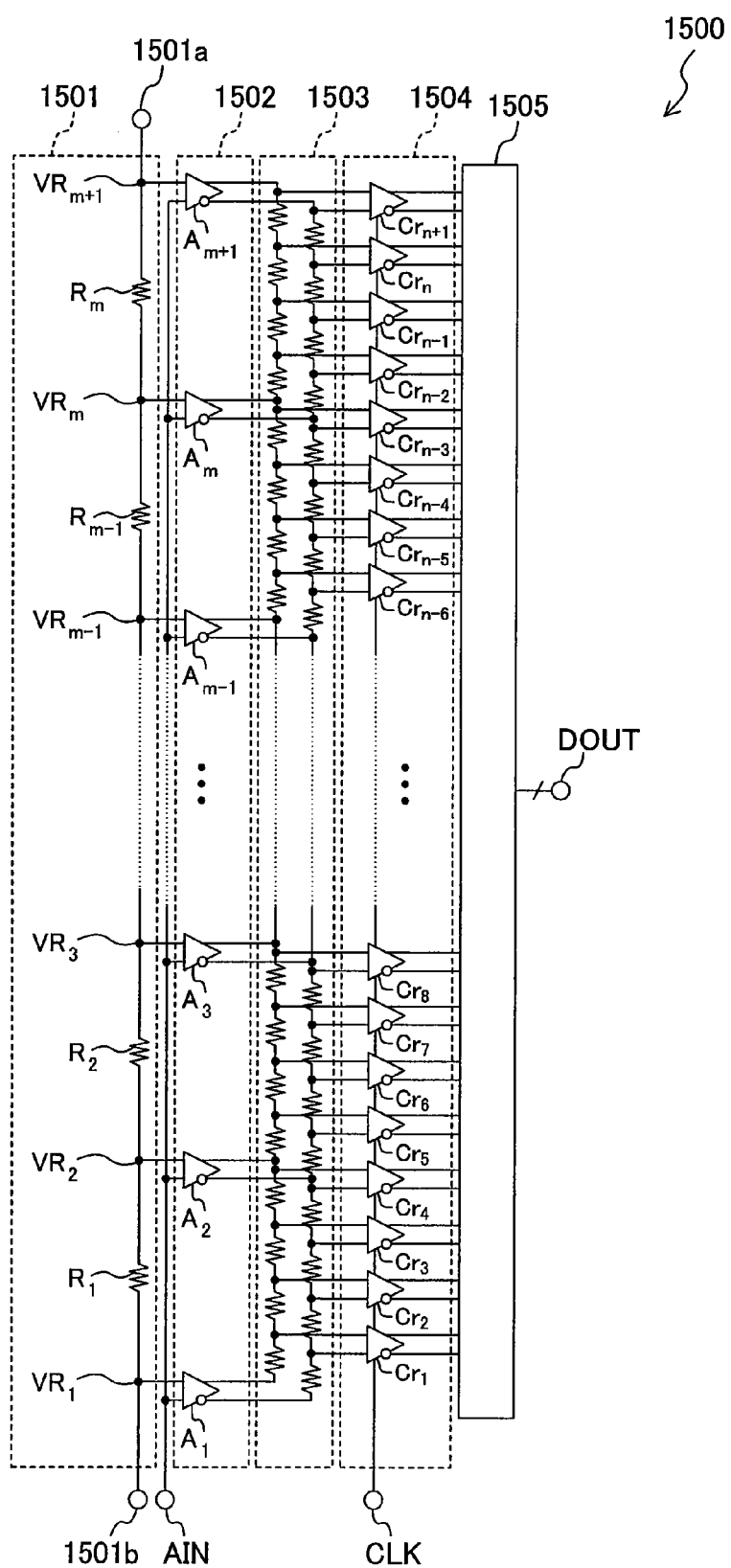
FIG. 15 shows a configuration of an improved conventional parallel-type A/D converter.
Figure 16:
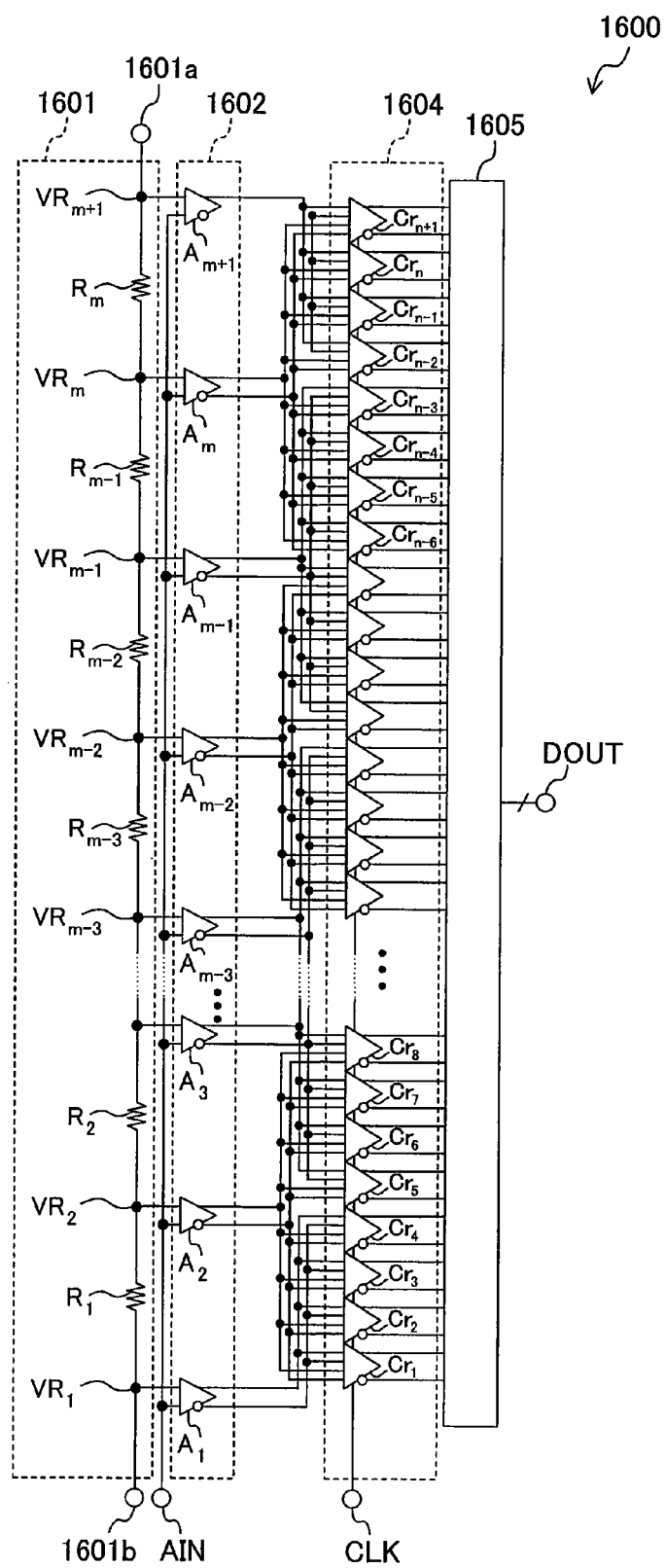
FIG. 16 shows a configuration of a further improved conventional parallel-type A/D converter.
Figure 17:
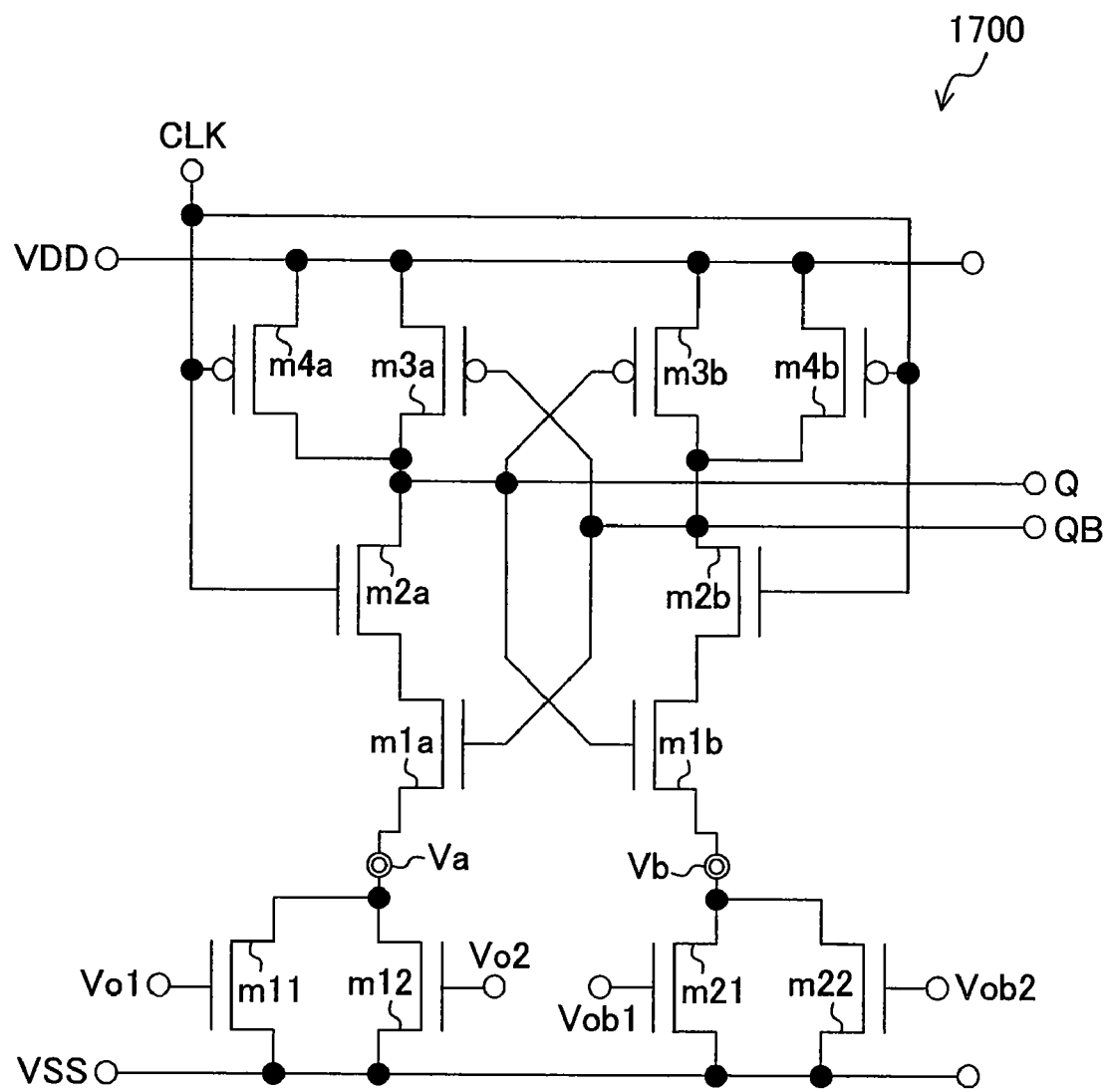
FIG. 17 shows a configuration of a comparator used in the conventional parallel-type A/D converter.
Figure 18:
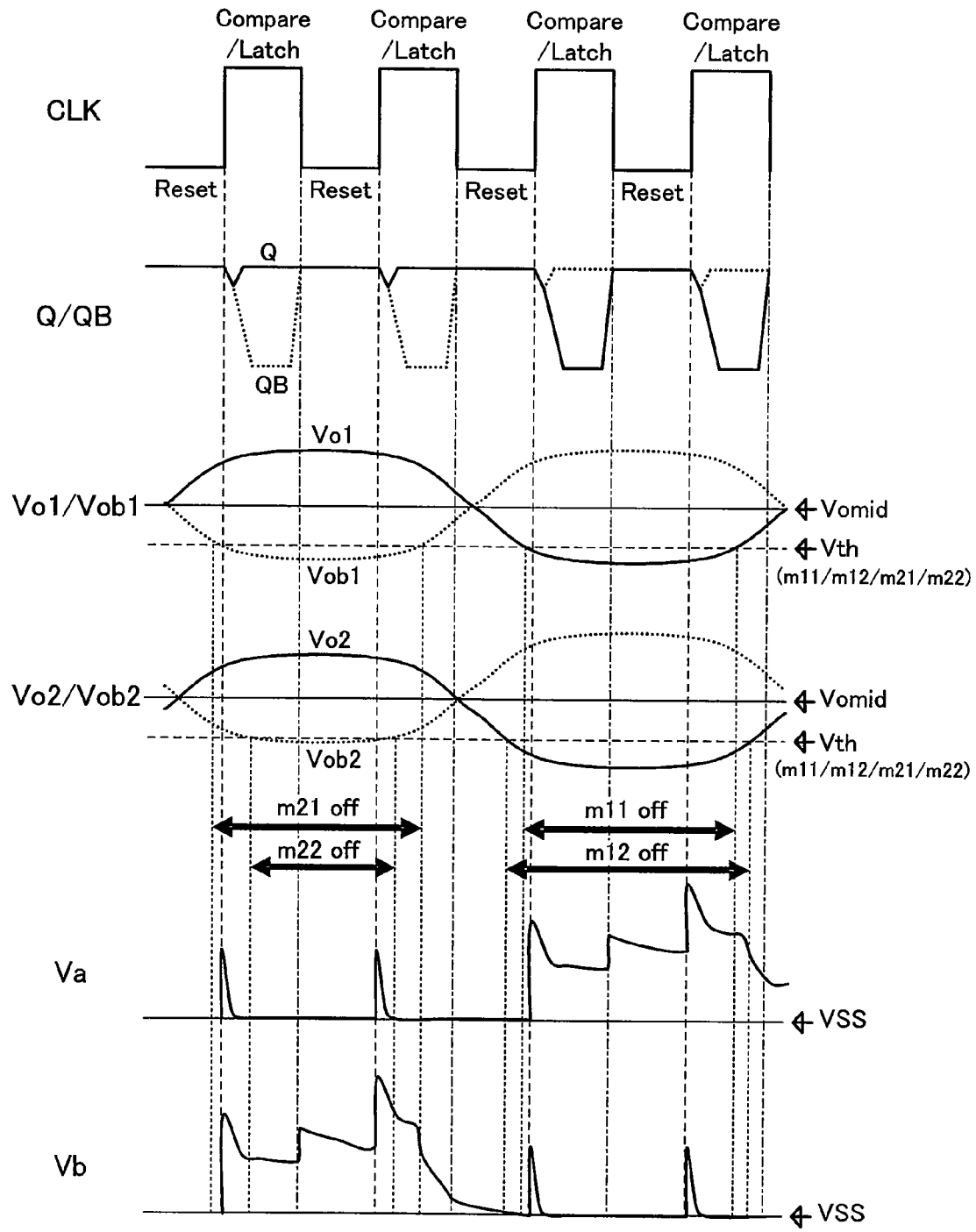
FIG. 18 shows a timing diagram of the conventional comparator.

FIG. 13 shows an exemplary configuration of a parallel-type A/D converter 1300 of Embodiment 10.

The parallel-type A/D converter 1300 shown in the figure includes a reference voltage generation circuit 1301, a chain of differential amplifiers 1302, a chain of comparators 1304, and an encoder circuit 1305.

The reference voltage generation circuit 1301 divides the voltage between a high voltage-side reference voltage 1301a and a low voltage-side reference voltage 1301b by m resistors R1 to Rm, being fewer than 2 to the power of N (N: the number of bits of the A/D converter), to generate reference voltages VR1 to VRm+1. VR1 to VRm+1 are input to the chain of differential amplifiers 1302. The chain of differential amplifiers 1302 includes m+1 differential amplifiers and performs predetermined amplification operations in parallel on the relationships between the analog input signal voltage received from the analog input signal voltage input terminal AIN and the reference voltages VR1 to VRm+1, the results of which are input to the chain of comparators 1304. Each comparator included in the chain of comparators 1304 is given the positive terminal and negative terminal outputs of two adjacent differential amplifiers. Each comparator may be any of the comparators described above, or may be any of the comparators described above provided with the inverted clock generation circuit 1100. The input transistor is formed with a predetermined size ratio and compares, while performing interpolation, the positive terminal and negative terminal outputs of two adjacent differential amplifiers in parallel and in synchronism with the clock signal CLK. The encoder circuit 1305 logically processes (converts) the comparison results output from the chain of comparators 1304 to thereby output a digital signal DOUT of a predetermined resolution. This is the exemplary configuration of the parallel-type A/D converter 1300 of Embodiment 10.

Next, referring to FIG. 13, a series of operations of the parallel-type A/D converter 1300 of Embodiment 10 will be described.

The reference voltage generation circuit 1301 includes m resistors R1 to Rm connected in series with one another, and the high voltage-side reference voltage 1301a and the low voltage-side reference voltage 1301b are applied at the opposite ends thereof. Thus, the voltage between the high voltage-side reference voltage 1301a and the low voltage-side reference voltage 1301b is divided to thereby generate the reference voltages VR1 to VRm+1.

Differential amplifiers A1 to Am+1 of the chain of differential amplifiers 1302 each have two input terminals, wherein the analog input signal voltage AIN is given to one input terminal and one of VR1 to VRm+1 generated by the reference voltage generation circuit 1301 is given to the other input terminal. The differential amplifiers output a set of output voltages, including positive terminal outputs (Vo1 to Vom+1) and negative terminal outputs (Vob1 to Vom+1).

Each one of the chain of comparators 1304 has one of the comparator configurations as described above. The operations thereof have already been described above, and will not be further described below.

The encoder circuit 1305 logically processes (converts) the comparison results output from the output terminals Q and QB of the comparators forming the chain of comparators 1304 to thereby output a digital signal of a predetermined resolution.

This is the description of the operation of the parallel-type A/D converter 1300 of Embodiment 10.

As described above, the parallel-type A/D converter 1300 of Embodiment 10 employs a chain of comparators including a plurality of comparators as described above, wherein the transistors included in the input transistor section of the comparator have a predetermined size ratio. As a result, there is no longer needed the chain of interpolation resistors, which is used with conventional techniques, thus reducing the operating current and the occupied area. Moreover, the comparator has a function of resetting the nodes Va and Vb to Vreset or the ground voltage VSS by using switches operating in synchronism with the inverted signal of the clock signal in the Reset state, whereby it is possible to reduce the deterioration of the comparison precision occurring when the clock signal frequency and the analog input signal frequency are high, which is a problem with conventional techniques, and it is possible to improve the characteristics of the A/D converter.

In the dynamic-type comparator described above, the number of comparators that receive a set of the positive terminal output voltage and the negative terminal output voltage of the first differential amplifier and a set of the positive terminal output voltage and the negative terminal output voltage of the second differential amplifier is four. The present invention is not limited to this, but similar effects can be obtained as long as the number of comparators is 2 to the power of n (n is a natural number).

In the dynamic-type comparator described above, NMOS transistors are used as switches for connecting the nodes Va and Vb with the predetermined reset voltage Vreset. Similar effects can be obtained also when using switches of similar functions, e.g., CMOS-type switches obtained by combining PMOS transistors and NMOS transistors, or CMOS switches with dummies for reducing the charge injection.

Moreover, in the dynamic-type comparator described above, NMOS transistors are used for the input transistor section 10. Similar effects can be obtained also when NMOS transistors are replaced by PMOS transistors by forming the input transistor section 10 with PMOS transistors.

INDUSTRIAL APPLICABILITY

As described above, according to the present invention, the comparison precision of the comparator can be maintained high even if the frequency of the clock signal and the frequency of the analog input signal are high, and the present invention is therefore useful as a dynamic-type comparator. Moreover, since the bandwidth of the analog input signal can be widened, the present invention is applicable to applications such as an A/D converter for an analog front end of a digital read channel, or a system for direct conversion that requires a wide analog input signal bandwidth.

The invention claimed is:

1. A comparator for receiving a plurality of differential voltage pairs and performing a comparison operation, in synchronism with a clock signal, on each difference voltage of the plurality of differential voltage pairs, comprising:
   an input transistor section for receiving the plurality of differential voltage pairs and performing a predetermined weighting operation and a voltage-current conversion operation on the plurality of differential voltage pairs, thus performing a differential comparison operation on each difference voltage of the plurality of weighted differential voltage pairs, and outputting a differential current pair being a result of the differential comparison;
   a positive feedback section for receiving the differential comparison result from the input transistor section and, in synchronism with the clock signal, amplifying the received differential comparison result to a predetermined voltage level to output the amplified result as a comparison result of the comparator, when the clock signal is at a predetermined level; and
   a reset section for resetting both of two connecting portions between the input transistor section and the positive feedback section to a predetermined reset voltage when the clock signal is not at the predetermined level, wherein:
   the reset section includes a reset voltage generator for generating the predetermined reset voltage;
   the reset voltage generator includes a replica circuit including at least one circuit portion of a differential pair of a circuit identical to a circuit formed by the input transistor section and the positive feedback section; and
   the reset voltage generator outputs, as the predetermined reset voltage, a voltage at a connecting portion between the input transistor section and the positive feedback section of the replica circuit.

2. The comparator of claim 1, wherein the predetermined reset voltage used in the reset operation by the reset section is a ground voltage.

3. A comparator for receiving a plurality of differential voltage pairs and performing a comparison operation, in synchronism with a clock signal, on each difference voltage of the plurality of differential voltage pairs, comprising:
   an input transistor section for receiving the plurality of differential voltage pairs and performing a predetermined weighting operation and a voltage-current conversion operation on the plurality of differential voltage pairs, thus performing a differential comparison operation on each difference voltage of the plurality of weighted differential voltage pairs, and outputting a differential current pair being a result of the differential comparison;
   a positive feedback section including a pair of feedback transistors for receiving the differential comparison result from the input transistor section and, in synchronism with the clock signal, amplifying the received differential comparison result to a predetermined voltage level to output the amplified result as a comparison result of the comparator, when the clock signal is at a predetermined level; and
   a pair of switch transistors each being connected in series with one of the pair of feedback transistors of the positive feedback section, wherein the switch transistors are switched by the clock signal to allow or prohibit an operation of the positive feedback section; and
   a reset section for resetting both of two connecting portions between the pair of feedback transistors of the positive feedback section and the pair of switch transistors to a predetermined reset voltage when the clock signal is not at the predetermined level, wherein:
   the reset section includes a reset voltage generator for generating the predetermined reset voltage;
   the reset voltage generator includes a replica circuit including at least one circuit portion of a differential pair of a circuit identical to a circuit formed by the input transistor section, the positive feedback section and the pair of switch transistors; and
   the reset voltage generator outputs, as the predetermined reset voltage, a voltage at a connecting portion between the feedback transistor of the positive feedback section and the switch transistor of the replica circuit.

4. The comparator of claim 3, wherein the predetermined reset voltage used in the reset operation by the reset section is a ground voltage.

5. The comparator of any of claim 1, 2, 3 or 4, wherein:
   the reset section is given an inverted signal of the clock signal which is given to the positive feedback section; and
   a delay circuit is provided for delaying the inverted signal of the clock signal given to the reset section by a predetermined amount of time.

6. An A/D converter for performing an A/D conversion by using the comparator of any of claim 1, 2, 3, or 4.

7. An A/D converter for performing an A/D conversion by using the comparator of claim 5.

* * * * *